United States Patent
Kim et al.

(10) Patent No.: US 10,431,162 B2
(45) Date of Patent: Oct. 1, 2019

(54) DISPLAY DEVICE

(71) Applicant: SAMSUNG DISPLAY CO., LTD., Yongin-si, Gyeonggi-do (KR)

(72) Inventors: Yang Wan Kim, Yongin-si (KR); Sun Ja Kwon, Yongin-si (KR); Byung Sun Kim, Yongin-si (KR); Hyun Ae Park, Yongin-si (KR); Su Jin Lee, Yongin-si (KR); Jae Yong Lee, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 118 days.

(21) Appl. No.: 15/338,757

(22) Filed: Oct. 31, 2016

(65) Prior Publication Data
US 2017/0337878 A1    Nov. 23, 2017

(30) Foreign Application Priority Data
May 18, 2016  (KR) .................. 10-2016-0060834

(51) Int. Cl.
*G09G 3/3233* (2016.01)
*G09G 3/3291* (2016.01)
*G09G 3/3266* (2016.01)
*H01L 27/12* (2006.01)
(Continued)

(52) U.S. Cl.
CPC ......... *G09G 3/3291* (2013.01); *G09G 3/3258* (2013.01); *G09G 3/3266* (2013.01); *H01L 27/1214* (2013.01); *G09G 3/20* (2013.01); *G09G 2300/0426* (2013.01); *G09G 2300/0809* (2013.01); *G09G 2300/0861* (2013.01);
(Continued)

(58) Field of Classification Search
CPC combination set(s) only.
See application file for complete search history.

(56) References Cited

U.S. PATENT DOCUMENTS

| 7,365,714 | B2  |   | 4/2008 | Yoo |
| 2009/0206770 | A1 | * | 8/2009 | Hong ................... G09G 3/3233 315/291 |
| 2010/0141570 | A1 |   | 6/2010 | Horiuchi et al. |

(Continued)

FOREIGN PATENT DOCUMENTS

| CN | 104914641 A | 9/2015 |
| KR | 10-0476368 B1 | 3/2005 |

OTHER PUBLICATIONS

Extended European Search Report was issued from the European Patent Office dated Sep. 12, 2017 with respect to the European Patent Application No. 17157097.1.

*Primary Examiner* — Temesghen Ghebretinsae
*Assistant Examiner* — Sosina Abebe
(74) *Attorney, Agent, or Firm* — Lee & Morse, P.C.

(57) ABSTRACT

A display device includes first pixels in a first pixel area, second pixels in a second pixel area, first stages, second stages, and third stages. The first pixels are electrically connected to first signal lines, second signal lines, and data lines. The second pixels are electrically connected to at least a portion of third signal lines, fourth signal lines, or data lines. The first stages supply a first signal to the first and third signal lines. The second stages supply a second signal to the second signal lines and at least one of the fourth signal lines. The third stages supply the second signal to the fourth signal lines other than the at least one fourth signal line connected to the second stages. The second stages are spaced from the third stages.

31 Claims, 14 Drawing Sheets

(51) Int. Cl.
*G09G 3/3258* (2016.01)
*G09G 3/20* (2006.01)
(52) U.S. Cl.
CPC ............... *G09G 2310/0281* (2013.01); *G09G 2310/0291* (2013.01)

(56) References Cited

U.S. PATENT DOCUMENTS

| | | | | |
|---|---|---|---|---|
| 2012/0212517 A1* | 8/2012 | Ahn | ........................ | G11C 19/28 345/690 |
| 2013/0050157 A1* | 2/2013 | Baek | ..................... | G09G 3/2022 345/204 |
| 2016/0217740 A1* | 7/2016 | Lee | ........................ | G09G 3/3258 |
| 2016/0351107 A1* | 12/2016 | Chen | ......................... | G09G 3/20 |
| 2017/0004784 A1 | 1/2017 | Cao et al. | | |

* cited by examiner

DISPLAY DEVICE

CROSS-REFERENCE TO RELATED APPLICATION

Korean Patent Application No. 10-2016-0060834, filed on May 18, 2016, and entitled, "Display Device," is incorporated by reference herein in its entirety.

BACKGROUND

1. Field

One or more embodiments described herein relate to a display device.

2. Description of the Related Art

An organic light emitting display includes pixels that emit light to form an image. Each pixel includes an organic light emitting diode having an organic light emitting layer between two electrodes. In operation, electrons injected from one electrode recombine with holes injected from the other electrode in the organic light emitting layer. The recombination of the holes and electrodes forms excitons. Light is emitted when the excitons transition to a stable state.

In order to control light emission, each pixel includes a pixel circuit coupled to the organic light emitting diode. The pixel circuit includes thin film transistors connected to wires that receive signals, for example, from a scan driver, a light emission driver, and a data driver. In such a display device, dead space is created when the drivers are mounted onto a panel that includes the pixels.

SUMMARY

In accordance with one or more embodiments, a display device includes first pixels in a first pixel area, the first pixels electrically connected to first signal lines, second signal lines, and data lines; second pixels in a second pixel area, the second pixels electrically connected to at least a portion of third signal lines, fourth signal lines, or data lines; first stages to supply a first signal to the first and third signal lines; second stages to supply a second signal to the second signal lines and at least one of the fourth signal lines; and third stages to supply the second signal to the fourth signal lines other than the at least one fourth signal line connected to the second stages, wherein the second stages are spaced from the third stages.

The first and third signal lines may be scan lines and the first signal may be a scan signal. The second and fourth signal lines may be light emission control lines and the second signal may be a light emission control signal. The first and third signal lines may be light emission control lines and the first signal may be a light emission control signal. The second and fourth signal lines may be scan lines and the second signal may be a scan signal. The second pixel area may be adjacent to the first pixel area.

The first pixel area may have a greater surface area than the second pixel area. A same number of first pixels may be arranged on each horizontal line in the first pixel area. A first number of second pixels may be on a first horizontal line at an upper side of the second pixel area, and a second number of second pixels may be on a second horizontal line at a lower side of the second pixel area, wherein the second number is different from the first number. A greater number of second pixels may be on the first horizontal line than on the second horizontal line. An upper side of the second pixel area may be adjacent to the first pixel area.

The second stages may be at one side of some of the first stages. The third stages may be at a lower side of the first stages. The display device may include first signal wires at one side of the first stages, wherein the first signal wires may supply power and driving signals to the first stages. The display device may include second signal wires at one side of the second stages and the third stages, wherein the second signal wires may supply power and driving signals to the second and third stages.

In accordance with another embodiment, a display device includes first stages in a second pixel area, the first stages to supply a first signal to first signal lines in a first pixel area and in a second pixel area; second stages in the second pixel area, the second stages to supply a second signal to second signal lines in the first pixel area and to at least one third signal line in the second pixel area; and third stages, spaced from the second stages, to supply the second signal to third signal lines other than the at least one third signal line in the second pixel area, wherein a first one of the third stages is to operate based on the second signal from a last one of the second stages.

The first signal lines may be scan lines and the first signal may be a scan signal. The second and third signal lines may be light emission control lines and the second signal may be a light emission control signal. The first signal lines may be light emission control lines and the first signal may be a light emission control signal. The second and third signal lines may be scan lines and the second signal may be a scan signal.

The first pixel area may have a greater surface area than the second pixel area. A same number of first pixels may be on each horizontal line in the first pixel area. A first number of second pixels may be on a first horizontal line at an upper side of the second pixel area, and a second number of second pixels may be on a second horizontal line at a lower side of the second pixel area, wherein the second number may be less than the first number. An upper side of the second pixel area may be adjacent to the first pixel area. The second stages may be at one side of some of the first stages. The third stages may be at a lower side of the first stages.

In accordance with one or more other embodiments, a display device includes pixels, first driver stages to supply a first signal to the pixels, second driver stages to supply a second signal which is different from the first signal to first pixels of the pixels, the second driver stages arranged at a first side of the first stages, and third driver stages to supply the second signal to second pixels of the pixels different from the first pixels, wherein the third driver stages are arranged at a second side of the first driver stages. The third driver stages may be aligned along a first curve. The second pixels may be aligned along a second curve. The first curve may be equal to the second curve. The second driver stages may be arranged in a direction different from the first curve.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
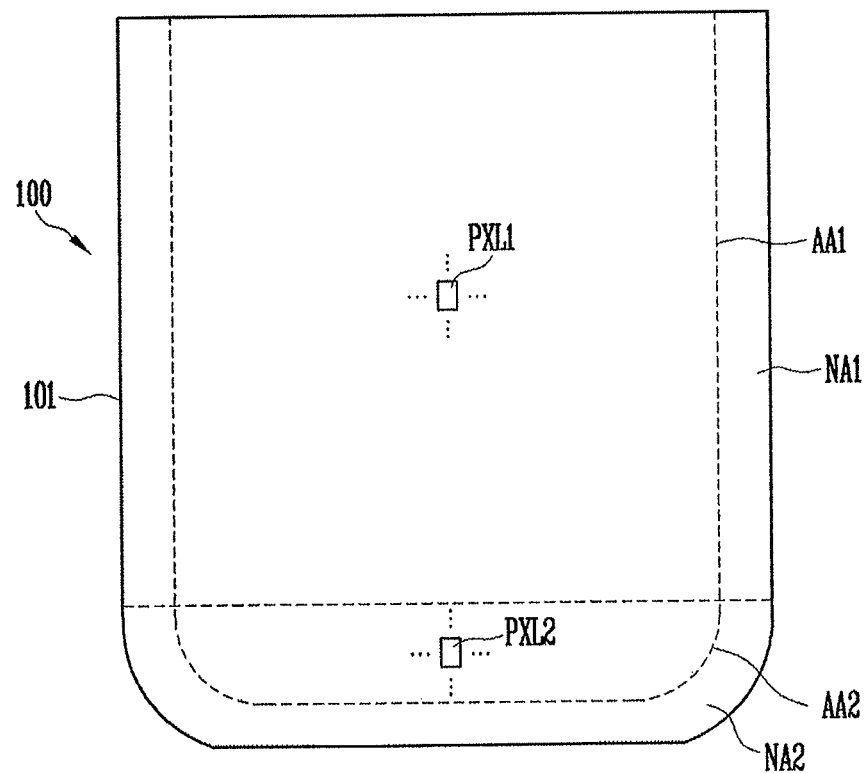
FIGS. 1A and 1B illustrate embodiments of a substrate.

Example embodiments will now be described more fully hereinafter with reference to the accompanying drawings; however, they may be embodied in different forms and should not be construed as limited to the embodiments set forth herein. Rather, these embodiments are provided so that this disclosure is thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected to" another element, it may be directly connected to the other element, or it may be indirectly connected to the other element through one or more intervening elements. Hereinafter, like reference numerals refer to like elements. In the drawings, the thickness or size of layers may be exaggerated for clarity and not necessarily drawn to scale. Like reference numerals refer to like elements throughout.

Figure 1B:
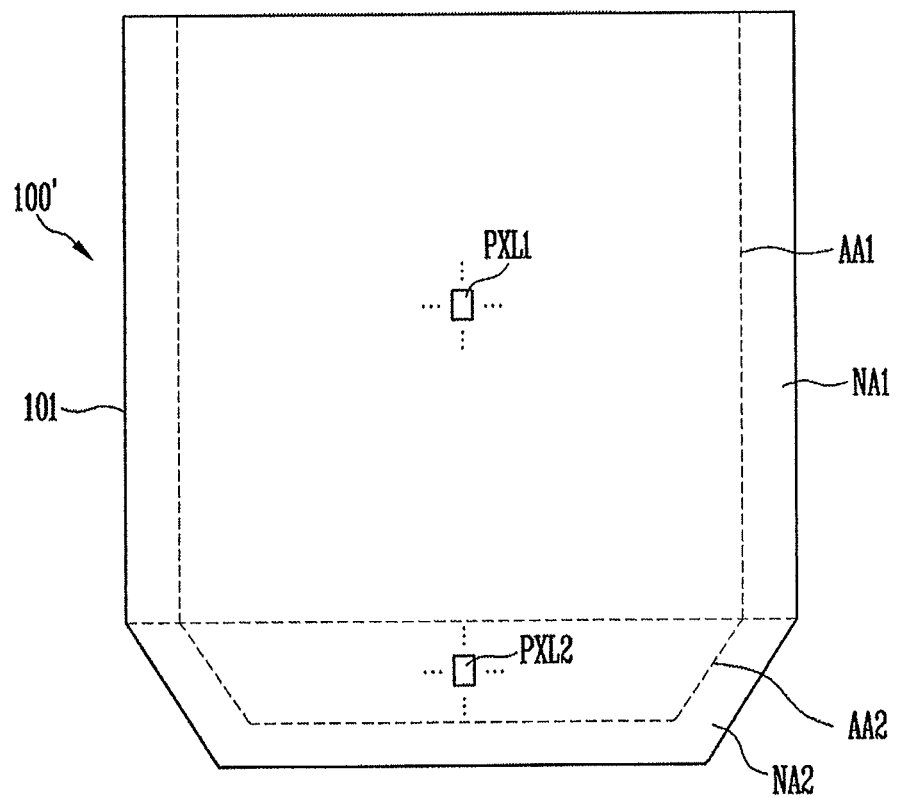

FIG. 1A illustrates an embodiment of a substrate 100, and FIG. 1B illustrates another embodiment of a substrate 100'. Referring to FIGS. 1A and 1B, each of the substrates 100 and 100' includes pixel areas AA1, AA2 and neighboring areas NA1, NA2. A plurality of pixels PXL1, PXL2 are in the pixel areas AA1, AA2 to form images, e.g., pixel areas AA1, AA2 are set as an effective display portion. Components for driving the pixels PXL1, PXL2 (for example, drivers and wires etc.) may be in the neighboring areas NA1, NA2. In some embodiments, the neighboring areas NA1, NA2 may not include any pixels PXL1, PXL2.

The neighboring areas NA1, NA2 are located, for example, on an exterior of the pixel areas AA1, AA2. The neighboring areas NA1, NA2 may surrounding at least a portion of the pixel areas AA1, AA2.

The pixel areas AA1, AA2 may include a first pixel area AA1, and a second pixel area AA2 at one side of the first pixel area AA1. The first pixel area AA1 may have a greater surface area than the second pixel area AA2.

The neighboring areas NA1, NA2 may include a first neighboring area NA1 and a second neighboring area NA2. The first neighboring area NA1 may be on a periphery of the first pixel area AA1 and may surround at least a portion of the first pixel area AA1. The second neighboring area NA2 may be on a periphery of the second pixel area AA2 and may surround at least a portion of the second pixel area AA2.

The pixels PXL1, PXL2 may include first pixels PXL1 and second pixels PXL2. The first pixels PXL1 may be in the first pixel area AA1. The second pixels PXL2 may be in the second pixel area AA2. The pixels PXL1, PXL2 may emit light with brightness based on control signals from drivers in the neighboring areas NA1, NA2. Each of the pixels PXL1, PXL2 may include, for example, an organic light emitting diode.

The substrates 100 and 100' may have various forms. For example, each of the substrates 100 and 100' may include a base substrate 101 having a plate form. The lower end corner portions of the base substrate 101 of substrate 100, that correspond to the second pixel area AA2 and the second neighboring area NA2, may have a curved line form with a certain curvature as illustrated in FIG. 1A. The lower end corner portions of the base substrate 101 of substrate 100' may have a different form, e.g., an angular form. In one embodiment, each of these lower end corner portions may have a certain diagonal line form as illustrated in FIG. 1B.

When the corner portions of the second pixel area AA2 and the second neighboring area NA2 have a curved line form or a diagonal line form, the second pixels PXL2 in the second pixel area AA2 may be arranged differently from the first pixels PXL1 in the first pixel area AA1. Examples of the arrangement configuration of the second pixels PXL2 will be explained below.

Each of the substrates 100 and 100' may be made of an insulating material such as glass, resin and the like. The substrates 100 and 100' may also be made of a flexible material to allow the substrates 100 and 100' to bend or fold. Also, the substrates 100 and 100' may have a single-layered structure or a multiple-layered structure.

For example, the substrates 100 and 100' may contain at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. The substrate 100 may be made of a different material (e.g., fiber glass reinforced plastic (FRP)) in other embodiments.

Figure 2A:
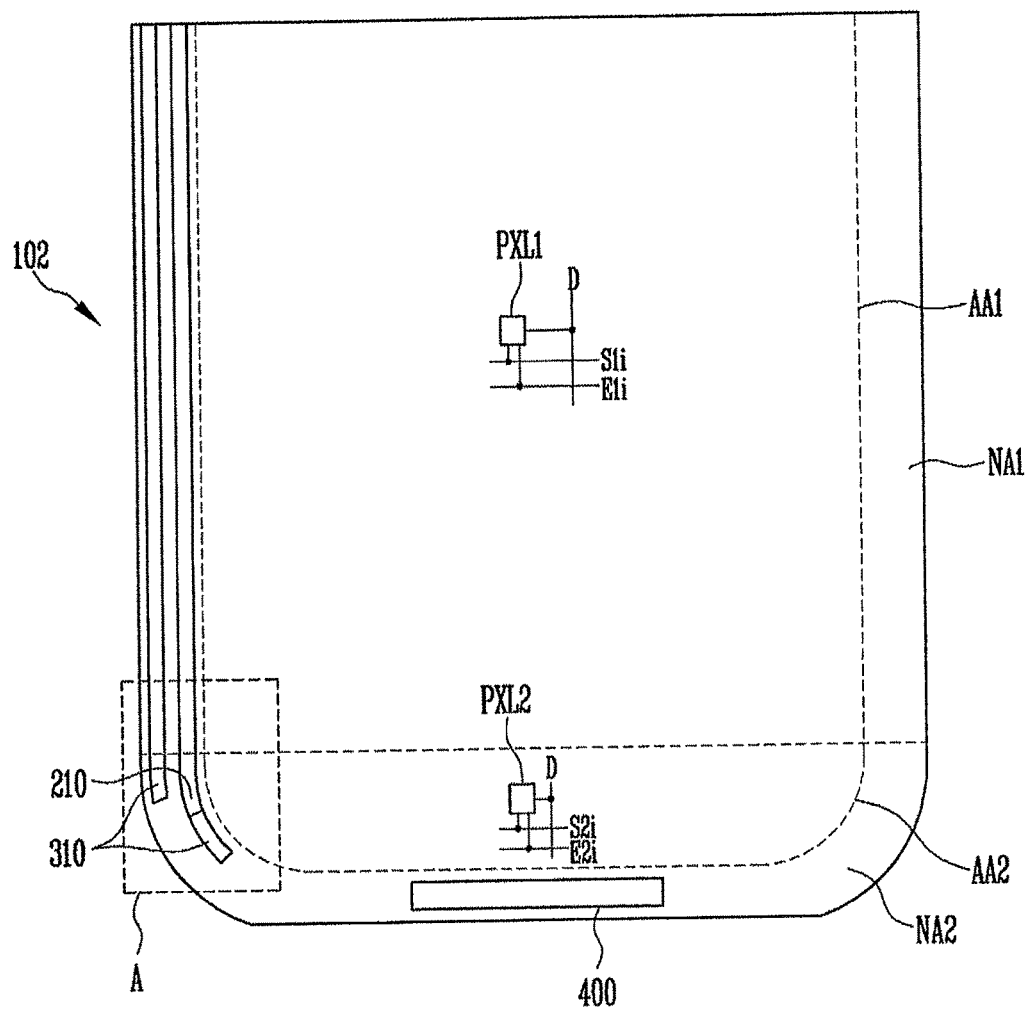
FIGS. 2A and 2B illustrate embodiments of an organic light emitting display.
Figure 2B:
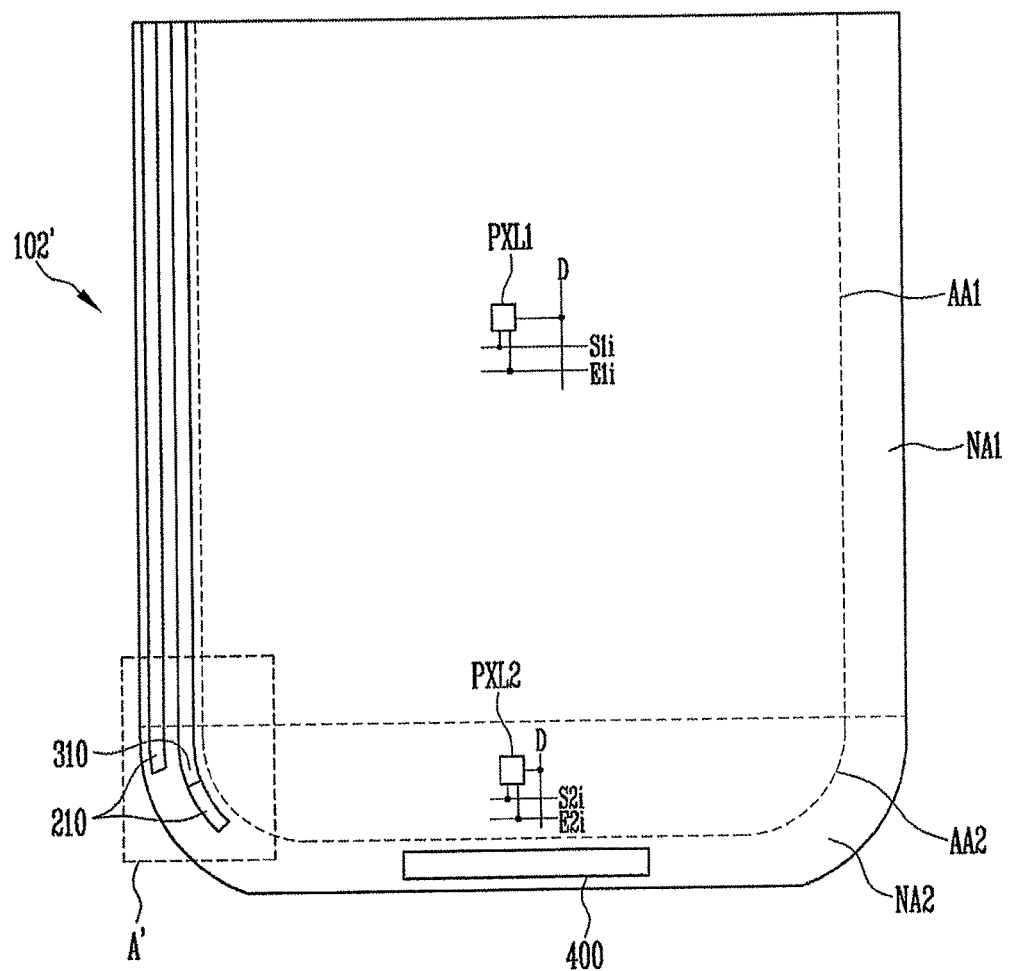

FIGS. 2A and 2B illustrate embodiments of an organic light emitting display. Referring to FIG. 2A, the organic light emitting display may include substrate 102, the first pixels PXL1, the second pixels PXL2, the scan driver 210, the light emission driver 310 and the data driver 400. The substrate 102 may correspond, for example, to substrate 100 in FIG. 1A. The first pixels PXL1 may be in the first pixel area AA1. Each of the first pixels PXL1 may be connected to a first scan line S1, a first light emission control line E1, and a data line D. The second pixels PXL2 may be in the second pixel area AA2. Each of the second pixels PXL2 may be connected to a second scan line S2, a second light emission control line E2, and a data line D.

The scan driver 210 may supply a scan signal to the first scan lines S1 and the second scan lines S2. For example, the scan driver 210 may drive the first pixels PXL1 and the second pixels PXL2. For this purpose, the scan driver 210 may be in the first neighboring area NA1 and in the second neighboring area NA2.

The scan driver 210 may have, for example, a curved line form in the second neighboring area NA2 that corresponds to the form of one of the corner portions of the second neighboring area NA2. The light emission driver 310 may have a curved line form in the second neighboring area NA2 that corresponds to one of the corner portions of the second neighboring area NA2.

The light emission driver 310 may supply a light emission control signal to the first light emission control line E1 and to the second light emission control line E2. For example, the light emission driver 310 may drive the first pixels PXL1 and the second pixels PXL2. The light emission driver 310 may be in the first neighboring area NA1 and in the second neighboring area NA2. From among the light emission stages of the light emission driver 310, some of the light emission stages in the second neighboring area NA2 may be at a lower side of the scan driver 210. Examples will be explained with reference to FIG. 11, that illustrates an expanded view of area A.

In FIG. 2A, the light emission driver 310 is on an exterior of the scan driver 210. In another embodiment as illustrated in FIG. 2B, the light emission driver 310 may be on an interior of the scan driver 210 on substrate 102'. When the positions of the light emission driver 310 and the scan driver 210 are configured as in FIG. 2B, some scan stages of the scan stages including the scan driver 210 may be at a lower side of the light emission driver 310. An example will be explained with reference to FIG. 12, that illustrates an expanded view of area A'.

The data driver 400 may supply a data signal to the pixels PXL1, PXL2 through the data lines D. A timing controller may be included to provide control signals to the scan driver 210, the light emission driver 310, and the data driver 400.

Figure 3:
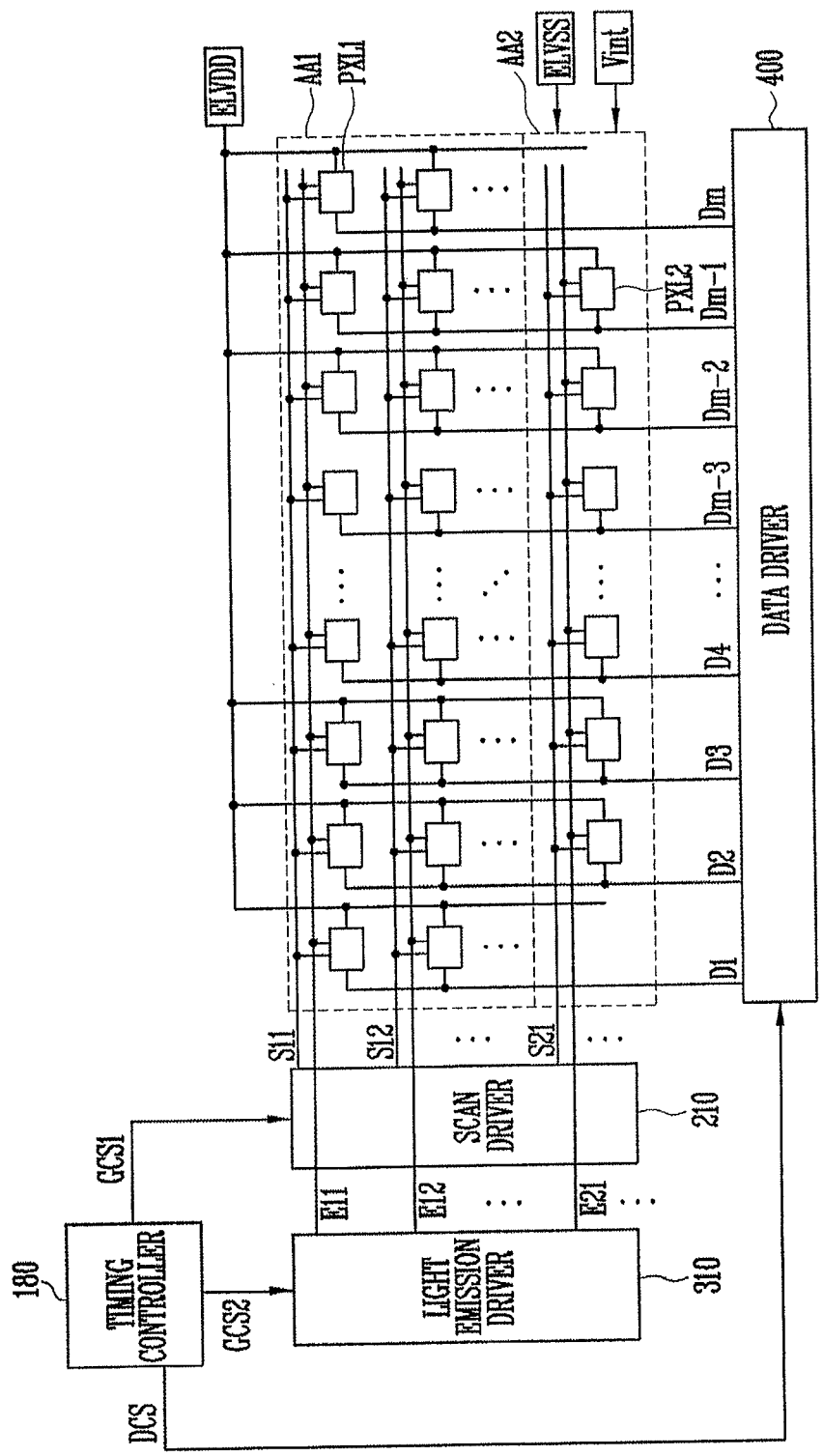
FIG. 3 illustrates another embodiment of an organic light emitting display.

FIG. 3 illustrates an embodiment of the organic light emitting display which includes the scan driver 210, the light emission driver 310, the data driver 400, the timing controller 180, the first pixels PXL1, and the second pixels PXL2.

The first pixels PXL1 are in the first pixel area AA1 at intersection areas of first scan lines S11, S12, . . . , first light emission control lines E11, E21, . . . , and data lines D1 to Dm. When a scan signal is supplied from the first scan lines S11, S12, . . . , the first pixels PXL1 are supplied with data signals from the data lines D1 to Dm. The first pixels PXL1 control an amount of current that flows from a first power ELVDD to a second power ELVSS via an organic light emitting diode based on the data signals through data lines D1 to Dm.

At least some of the second pixels PXL2 are in the second pixel area AA2 at intersection areas of second scan lines S21, . . . , second light emission control lines E21, . . . and data lines D2 to Dm−1. When a scan signal is supplied from the second scan lines S21, . . . , these second pixels PXL2 are supplied with data signals from the data lines D2 to Dm−1. The second pixels PXL2 control an amount of current that flows from the first power ELVDD to the second power ELVSS via the organic light emitting diode based on the data signals through D2 to Dm−1.

In FIG. 3, the second pixels PXL2 are arranged on one horizontal line. In another embodiment, the second pixels PXL2 may be on a plurality of horizontal lines. Accordingly, a plurality of second scan lines S2 and second light emission control lines E2 may be formed.

The number of data lines D connected to the second pixels PXL2 may be set differently for each horizontal line in the second pixel area AA2. For example, the second pixels PXL2 on a second horizontal line of the second pixel area AA2 may be connected to the data lines D3 to Dm−2. The second pixels PXL2 on a third horizontal line may be connected to the data lines D4 to Dm−3. Thus, the number of second pixels PXL2 arranged on each horizontal line may vary depending on the curved line form or the diagonal line form of the second pixel area AA2. The number of data lines D connected accordingly may also change.

The scan driver 210 supplies a scan signal to the first scan lines S11, S21, . . . and the second scan lines S21, . . . in response to a first gate control signal GCS1 from the timing controller 180. For example, the scan driver 210 may sequentially supply the scan signal to the first scan lines S11, S12, . . . and to the second scan lines S21, . . . . When the scan signal is sequentially supplied to the first scan lines S11, S21, . . . and to the second scan lines S21, . . . , the first pixels PXL1 and the second pixels PXL2 are selected sequentially in horizontal line units. Such a scan driver 210 may be mounted onto the substrate through a thin film process. Otherwise, the scan driver 210 may be mounted onto multiple respective sides of the substrate, with the first pixel area AA1 and the second pixel area AA2 therebetween.

The light emission driver 310 supplies a light emission control signal to the first light emission control signals E11, E12, . . . and the second light emission control signals E21, . . . in response to a second gate control signal GCS2 from the timing controller 180. For example, the light emission driver 310 may sequentially supply the light emission control signal to the first light emission control lines E11, E12, . . . and the second light emission control lines E21, . . . . Such a light emission control signal controls the light emission time of the pixels PXL1, PXL2. The light emission control signal may be, for example, set to have a greater width than the scan signal.

The light emission control signal may be set to a gate off voltage (for example, high voltage) to turn off transistors in the pixels PXL1, PXL2. The scan signal may be set to a gate on voltage (for example, low voltage) to turn on transistors in the pixels PXL1, PXL2.

The data driver 400 supplies data signals to the data lines D1 to Dm in response to a data control signal DCS. The data signals supplied to the data lines D1 to Dm are supplied to the pixels PXL1, PXL2 selected by the scan signal. The data driver 400 may be at a lower side of the first pixel area AA1. In another embodiment, the data driver 400 may be at an upper side of the first pixel area AA1.

The timing controller 180 supplies the gate control signals GCS1 to GCS2 to the scan driver 210 and the light emission driver 310, respectively, and supplies the data control signal DCS to the data driver 400. The gate control signals GCS1 to GCS2 may be generated based on timing signals supplied from an external source.

Each of the gate control signals GCS1 to GCS2 includes a start pulse and clock signals. The start pulse controls timing of a first scan signal or a first light emission control signal. The clock signals are used to shift the start pulse.

The data control signal DCS includes a source start pulse and clock signals. The source start pulse controls a sampling starting point of data. The clock signals are used to control a sampling operation.

Figure 4:
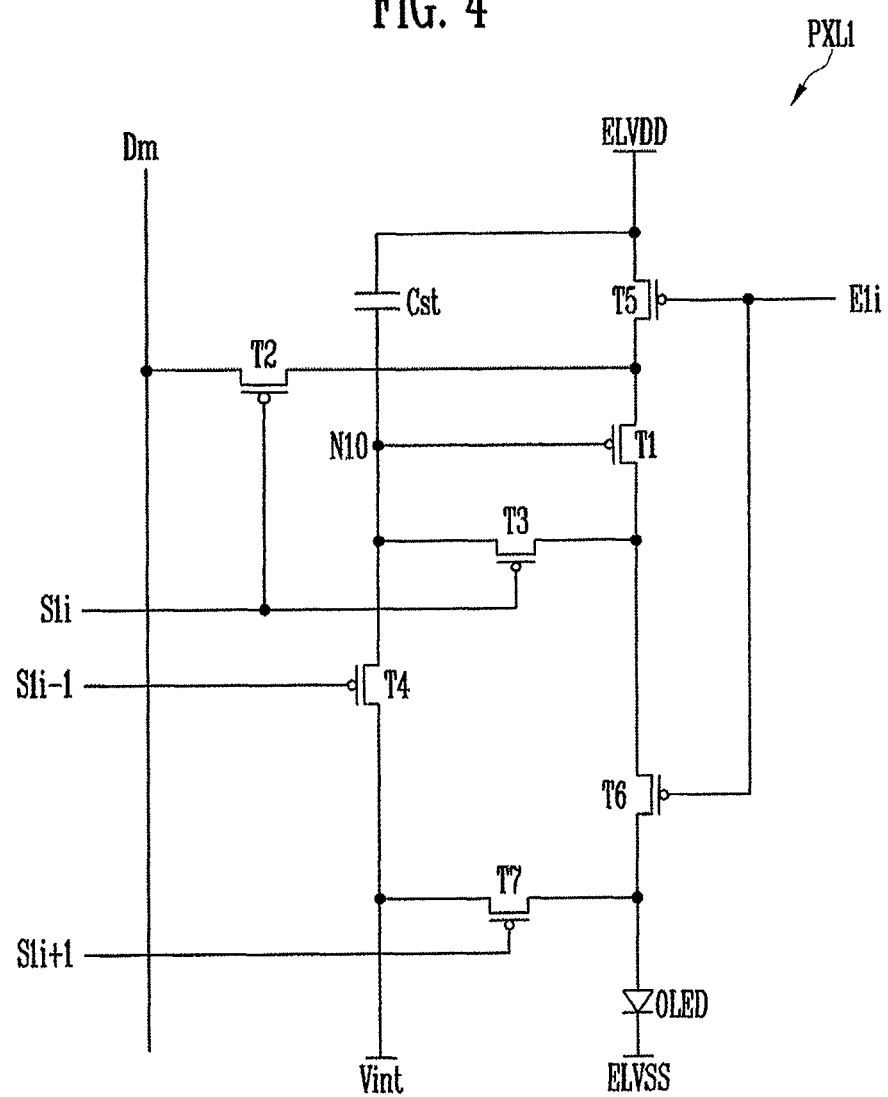
FIG. 4 illustrates an embodiment of a pixel.

FIG. 4 illustrates an embodiment of a pixel, which, for example, may be representative of first pixels PXL1 in FIG. 3. For illustrative purposes only, a pixel connected to the $m^{th}$ data line Dm and $i^{th}$ first scan line S1$i$ will be discussed.

Referring to FIG. 4, the first pixel PXL1 includes an organic light emitting diode OLED, a first transistor T1 to a seventh transistor T7, and a storage capacitor Cst. The OLED has an anode electrode connected to the first transistor T1 via the sixth transistor T6 and a cathode electrode connected to the second power ELVSS. Such an organic light emitting diode (OLED) generates light with a brightness that is based on the amount of current provided from the first transistor T1. The first power ELVDD may be set to a higher voltage than the second source ELVSS so that current flows to the OLED.

The seventh transistor T7 is connected between an initialization power source Vint and the anode electrode of the OLED. The seventh transistor T7 has a gate electrode connected to a i+1$^{th}$ first scan line S1i+1. The seventh transistor T7 is turned on when a scan signal is supplied to the i+1$^{th}$ scan line S1i+1 to supply the voltage of the initialization power source Vint to the anode electrode of the OLED. The voltage of the initialization power source Vint may be set to a lower voltage than the data signals.

The sixth transistor T6 is connected between the first transistor T1 and the OLED. The sixth transistor T6 has a gate electrode connected to a i$^{th}$ first light emission control line E1i. The sixth transistor T6 is turned off when a light emission control signal is supplied to the i$^{th}$ first light emission control line E1i, but may be turned on otherwise.

The fifth transistor T5 is connected between the first power ELVDD and the first transistor T1. The fifth transistor T5 has a gate electrode connected to the i$^{th}$ first light emission control line E1i. The fifth transistor T5 is turned off when the light emission control signal is supplied to the i$^{th}$ first light emission control line E1i, but may be turned on otherwise.

The first electrode of the first transistor T1 (driving transistor) is connected to the first power ELVDD via the fifth transistor T5. The second electrode is connected to the anode electrode of the OLED via the sixth transistor T6. The first transistor T1 may have a gate electrode connected to a tenth node N10. The first transistor T1 controls the amount of current that flows from the first power ELVDD to the second power ELVSS via the OLED depending on the voltage of the tenth node N10.

The third transistor T3 is connected between a second electrode of the first transistor T1 and the tenth node N10. The third transistor T3 has a gate electrode connected to the i$^{th}$ first scan line S1i. The third transistor T3 may be turned on when a scan signal is supplied to the i$^{1h}$ first scan line S1i to electrically connect the second electrode of the first transistor T1 and the tenth node N10. Therefore, when the third transistor T3 is turned on, the first transistor T1 is connected in a diode form.

The fourth transistor T4 is connected between the tenth node N10 and the initialization power source Vint. The fourth transistor T4 has a gate electrode connected to a i–1$^{th}$ first scan line S1i-1. The fourth transistor T4 is turned on when a scan signal is supplied to the i–1$^{th}$ first scan line S1i-1 and supplies the voltage of the initialization power source Vint to the tenth node N10.

The second transistor T2 is connected between the m$^{th}$ data line Dm and the first electrode of the first transistor T1. The second transistor T2 has a gate electrode connected to the i$^{th}$ first scan line S1i. The second transistor T2 is turned on when a scan signal is supplied to the i$^{th}$ first scan line S1i to electrically connect the m$^{th}$ data line Dm and the first electrode of the first transistor T1.

The storage capacitor Cst is connected between the first power ELVDD and the tenth node N10. The storage capacitor Cst stores data signals and a voltage corresponding to a threshold voltage of the first transistor T1.

The second pixel PXL2 may have the same structure as the first pixel PXL1.

Figure 5:
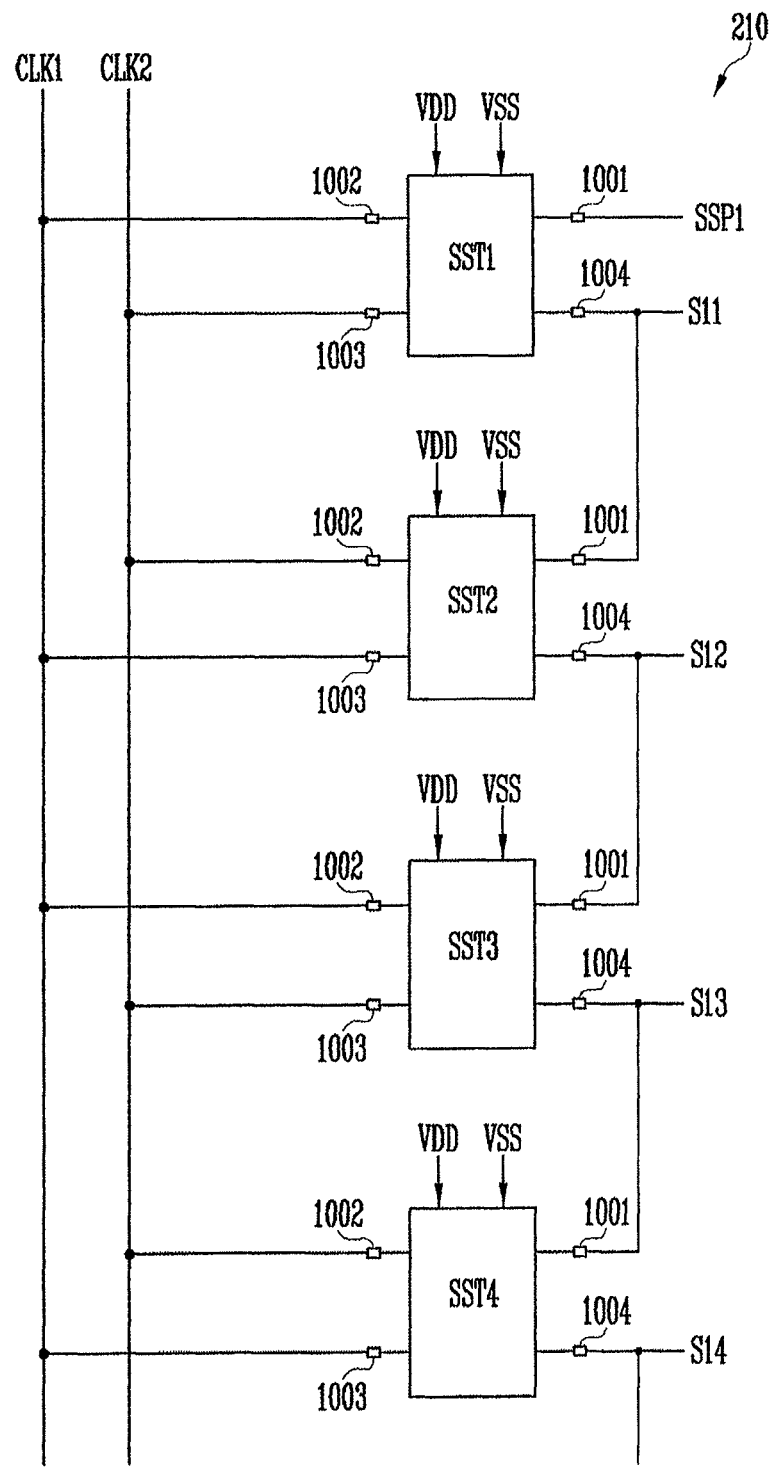
FIG. 5 illustrates an embodiment of a scan driver.

FIG. 5 illustrates an embodiment of the scan driver 210 which includes a plurality of scan stages SST1 to SST4. Each of the scan stages SST1 to SST4 is connected to one of the first scan lines S11 to S14 and operates in response to the clock signal CLK1 and CLK2. These scan stages SST1 to SST4 may be embodied as identical circuits. In FIG. 5, the scan driver 210 has four scan stages but may have a different number of scan stages in another embodiment.

Each of the scan stages SST1 to SST4 includes a first input terminal 1001 to a third input terminal 1003 and an output terminal 1004. The first input terminal 1001 recites an output signal (that is, the scan signal) of a previous scan stage or a first start pulse SSP1. For example, the first input terminal 1001 of the first scan stage SST1 recites the first start pulse SSP1, and the first input terminal 1001 of the remaining scan stages SST2 to SST4 recites the output signal of the previous stage.

The second input terminal 1002 of a j$^{th}$ (j being an odd number or even number) scan stage SSTj receives a first clock signal CLK1. The third input terminal 1003 of the j$^{th}$ scan stage SSTj receives a second clock signal CLK2. The second input terminal 1002 of a j+1$^{th}$ scan stage SSTj+1 receives the second clock signal CLK2, and the third input terminal 1003 of the j+1$^{th}$ scan stage SSTj+1 receives the first clock signal CLK1.

The first clock signal CLK1 and the second clock signal CLK2 have an identical cycle, but their phases do not overlap each other. For example, based on the assumption that a cycle in which a scan signal is supplied to one first scan line S1 is one horizontal cycle 1H, each of the clock signals CLK1 and CLK2 may have a cycle of two horizontal cycles 2H. The clock signals CLK1 and CLK2 are supplied during different horizontal periods.

Each of the scan stages SST1 to SST4 receives the first power VDD and the second power VSS. The first power VDD may be set to a gate off voltage, for example, a high voltage. The second power VSS may be set to a gate on voltage, for example, a low voltage.

Figure 6:
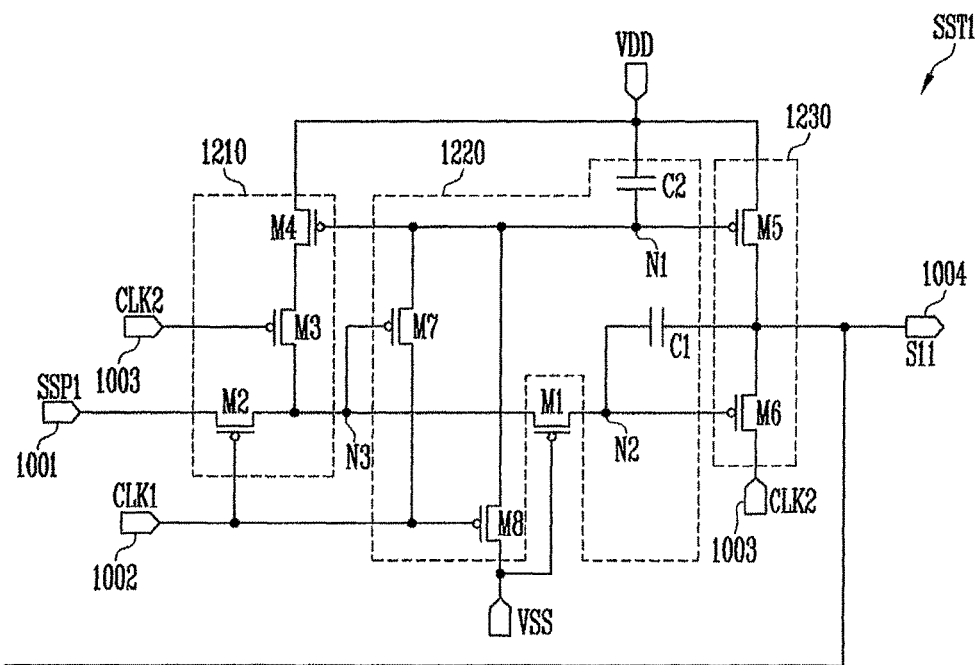
FIG. 6 illustrates an embodiment of a scan stage.
Figure 6:
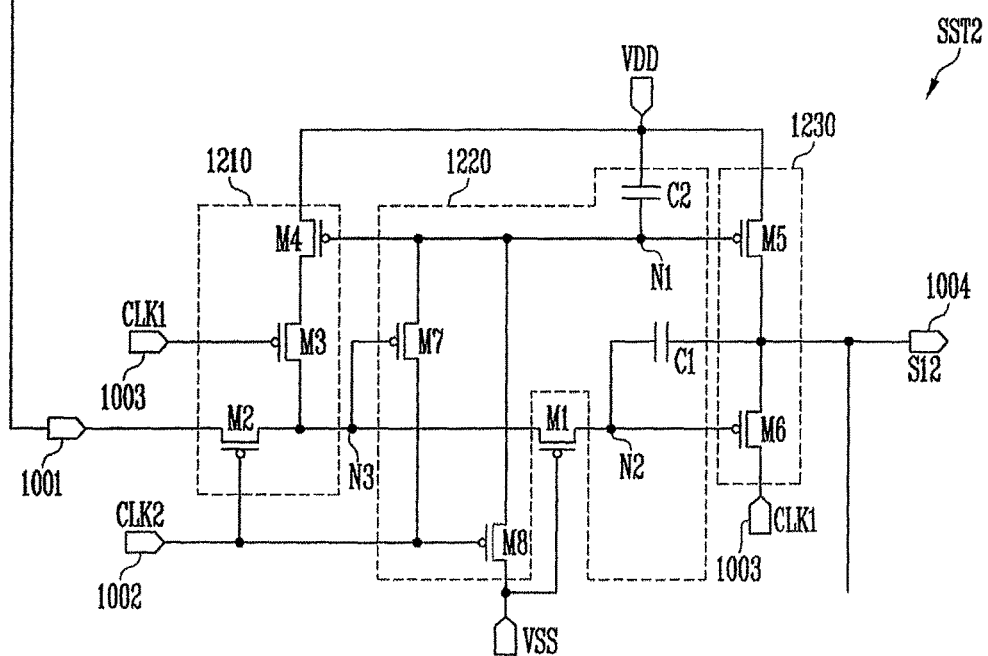

FIG. 6 illustrates an embodiment of a scan stage, which, for example, is representative of the scan stages in FIG. 5. For illustrative purposes only, the first scan stage SST1 and the second scan stage SST2 are illustrated.

Referring to FIG. 6, the first scan stage SST1 includes a first driver 1210, a second driver 1220, an output circuit 1230 (or buffer), and a first transistor M1. The output circuit 1230 controls a voltage supplied to the output terminal 1004 in response to voltages of a first node N1 and a second node N2. The output circuit 1230 includes a fifth transistor M5 and a sixth transistor M6.

The fifth transistor M5 is between the first power VDD and the output terminal 1004. The fifth transistor M5 has a gate electrode M5 connected to the first node N1. The fifth transistor M5 controls connection between the first power VDD and the output terminal 1004 in response to a voltage being applied to the first node N1.

The sixth transistor M6 is between the output terminal 1004 and a third input terminal 1003. The sixth transistor M6 has a gate electrode connected to the second node N2. The sixth transistor M6 controls connection between the output terminal 1004 and the third input terminal 1003 in response to a voltage applied to the second node N2. The output circuit 1230 may operate as a buffer. In another embodiment, the fifth transistor M5 and/or the sixth transistor M6 may be replaced by circuits that include a plurality of transistors connected in parallel.

The first driver 1210 controls a voltage of a third node N3 in response to signals supplied to the first input terminal 1001 to the third input terminal 1003. For this purpose, the first driver 1210 includes a second transistor M2 to a fourth transistor M4.

The second transistor M2 is between the first input terminal 1001 and the third node N3. The second transistor M2 has a gate electrode connected to the second input terminal 1002. The second transistor M2 controls connection between the first input terminal 1001 and the third node N3 in response to a signal supplied to the second input terminal 1002.

The third transistor M3 and the fourth transistor M4 are connected in series between the third node N3 and the first power VDD. The third transistor M3 is between the fourth transistor M4 and the third node N3. The third transistor M3 has a gate electrode connected to the third input terminal 1003. The third transistor M3 controls connection between the fourth transistor M4 and the third node N3 in response to a signal provided to the third input terminal 1003.

The fourth transistor M4 is between the third transistor M3 and the first power VDD. The fourth transistor M4 has a gate electrode connected to the first node N1. The fourth transistor M4 controls connection between the third transistor M3 and the first power VDD in response to a voltage of the first node N1.

The second driver 1220 controls a voltage of the first node N1 in response to a voltage of the second input terminal 1002 and the third node N3. The second driver 1220 includes a seventh transistor M7, an eighth transistor M8, a first capacitor C1, and a second capacitor C2.

The first capacitor C1 is connected between the second node N2 and the output terminal 1004. The first capacitor C1 charges a voltage corresponding to a turn-on and turn-off of the sixth transistor M6.

The second capacitor C2 is connected between the first node N1 and the first power VDD. The second capacitor C2 charges a voltage applied to the first node N1.

The seventh transistor M7 is between the first node N1 and the second input terminal 1002. The seventh transistor M7 has a gate electrode connected to the third node N3. The seventh transistor M7 controls connection between the first node N1 and the second input terminal 1002 in response to a voltage of the third node N3.

The eighth transistor M8 is between the first node N1 and a second power VSS The eighth transistor M8 has a gate electrode connected to the second input terminal 1002. The eighth transistor M8 controls connection between the first node N1 and the second power VSS in response to a signal of the second input terminal 1002.

The first transistor M1 is between the third node N3 and the second node N2. The first transistor M1 has a gate electrode connected to the second power VSS. The first transistor M1 maintains the electrical connection between the third node N3 and the second node N2 during a turned-on state. The first transistor M1 limits the extent of voltage drop of the third node N3 in response to the voltage of the second node N2. For example, even when the voltage of the second node N2 drops below the voltage of the second power VSS, the voltage of the third node N3 does not fall below a threshold voltage of the first transistor M1 subtracted from the second power VSS.

Figure 7:
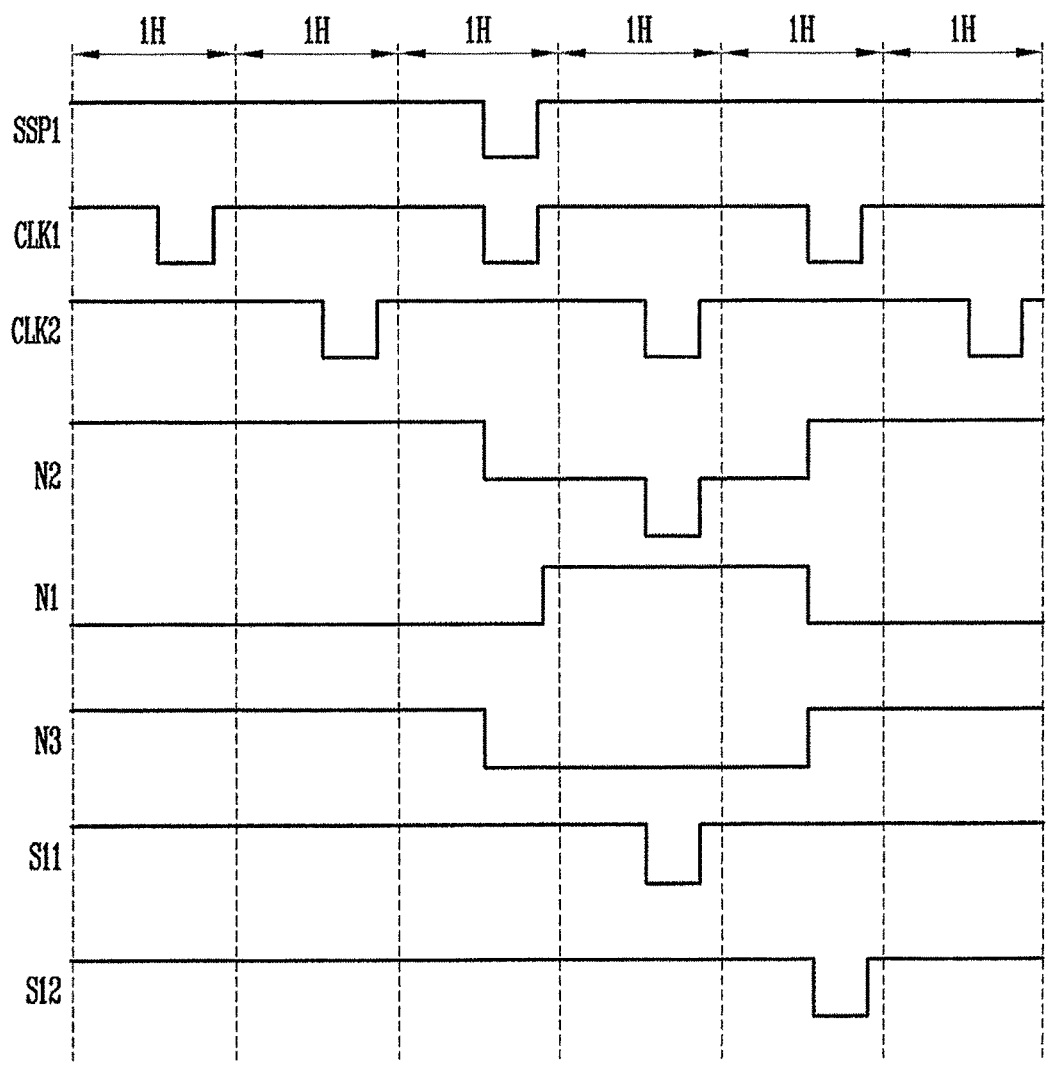
FIG. 7 illustrates an embodiment of a method for driving a scan stage.

FIG. 7 illustrates an embodiment of a method for driving the scan stage in FIG. 6, e.g., the first scan stage SST1.

Referring to FIG. 7, each of the first clock signal CLK1 and the second clock signal CLK2 has a cycle of two horizontal periods 2H. The first clock signal CLK1 and the second clock signal CLK2 are supplied in different horizontal periods. For example, the second clock signal CLK2 is set as a signal that is shifted by as much as a half cycle (e.g., one horizontal period) from the first clock signal CLK1. The first start pulse SSP1 received by the first input terminal 1001 is synchronized with the clock signal supplied to the second input terminal 1002, e.g., the first clock signal CLK1.

When the first start pulse SSP1 is received, the first input terminal 1001 may be set to the voltage of the second power VSS. When the first start pulse SSP1 is not received, the first input terminal 1001 may be set to the voltage of the first power VDD. When the clock signal CLK is received by the second input terminal 1002 and the third input terminal 1003, the second input terminal 1002 and the third input terminal 1003 may be set to a voltage of the second power VSS. When the clock signal CLK is not received by the second input terminal 1002 and the third input terminal 1003, the second input terminal 1002 and the third input terminal 1003 may be set to a voltage of the first power VDD.

In operation, initially, the first start pulse SSP1 is supplied synchronized with the first clock signal CLK1. When the first clock signal CLK1 is received, the second transistor M2 and the eighth transistor M8 are turned-on. When the second transistor M2 is turned-on, the first input terminal 1001 and the third node N3 are electrically connected to each other. Since the first transistor M1 is set to be in a turned-on state all the time, the second node N2 maintains electrical connection with the third node N3.

When the first input terminal 1001 and the third node N3 are electrically connected to each other, the third node N3 and the second node N2 are set to a low voltage by the first start pulse SSP being supplied to the first input terminal 1001. When the third node N3 and the second node N2 are set to a low voltage, the sixth transistor M6 and the seventh transistor M7 are turned-on.

When the sixth transistor M6 is turned-on, the third input terminal 1003 is electrically connected to the output terminal 1004. The third input terminal 1003 is set to a high voltage (that is, the second clock signal CLK2 is not supplied). Accordingly, a high voltage is also output to the output terminal 1004. When the seventh transistor M7 is turned-on, the second input terminal 1002 is electrically connected to the first node N1. Then, the voltage of the first clock signal CLK1 received by the second input terminal 1002, that is, the low voltage, is supplied to the first node N1.

When the first clock signal CLK1 is supplied, the eighth transistor M8 is turned-on. When the eighth transistor M8 is turned-on, the voltage of the second power VSS is also supplied to the first node N1. The voltage of the second power VSS is set to a voltage identical (or similar) to the first clock signal CLK1. Accordingly, the first node N1 maintains the low voltage with stability.

When the first node N1 is set to a low voltage, the fourth transistor M4 and the fifth transistor M5 are turned-on. When the fourth transistor M4 is turned-on, the first power VDD and the third transistor M3 are electrically connected to each other. In this case, since the third transistor M3 is set to a turned-off state, the third node N3 maintains the low voltage with stability, even when the fourth transistor M4 is turned-on. When the fifth transistor M5 is turned-on, the voltage of the first power VDD received by the output terminal 1004. In this case, the voltage of the first power VDD is set to a voltage identical to the high voltage supplied to the third input terminal 1003. Accordingly, the output terminal 1004 maintains the high voltage with stability.

Then, the supply of the start pulse SSP1 and the first clock signal CLK1 is stopped. When the supply of the first clock signal CLK1 is stopped, the second transistor M2 and the eighth transistor M8 are turned-off. At this point, the sixth transistor M6 and the seventh transistor M7 maintain their turned-on state based on the voltage stored in the first capacitor C1. Thus, the second node N2 and the third node N3 are maintained at the low voltage based on the voltage stored in the first capacitor C1.

When the sixth transistor M6 maintains the turned-on state, the output terminal 1004 and the third input terminal 1003 maintain their electrical connection. When the seventh transistor M7 maintains the turned-on state, the first node N1 maintains the electrical connection with the second input terminal 1002. The voltage of the second input terminal 1002 is set to a high voltage when the first clock signal CLK1 is no longer received. Accordingly, the first node N1 is also set to a high voltage. The fourth transistor M4 and the fifth transistor M5 are turned-off when the high voltage is supplied to the first node N1.

Then, the second clock signal CLK2 is supplied to the third input terminal. At this point, since the sixth transistor M6 is set to a turned-on state, the second clock signal CLK2 supplied to the third input terminal 1003 is also supplied to the output terminal 1004. The output terminal 1004 outputs the second clock signal CLK2 to the first scan line S11 as a scan signal.

When the second clock signal CLK2 is supplied to the output terminal 1004, the voltage of the second node N2 drops below the second power VSS due to coupling of the first capacitor C1. Accordingly, the sixth transistor M6 maintains the turned-on state with stability.

Even when the voltage of the second node N2 drops, the voltage of the third node N3 is maintained at approximately the voltage of the second power VSS (e.g., the threshold voltage of the first transistor M1 subtracted from the second power VSS) by the first transistor M1.

After the scan signal is output to the first scan line S11, the supply of the second clock signal CLK2 is stopped. When the supply of the second clock signal CLK2 is stopped, the output terminal 1004 outputs a high voltage. Furthermore, the voltage of the second node N2 rises to approximately the voltage of the second power VSS in response to the high voltage of the output terminal 1004.

Then, the first clock signal CLK1 is supplied. When the first clock signal CLK1 is supplied, the second transistor M2 and the eighth transistor M8 are turned-on. When the second transistor M2 is turned-on, the first input terminal 1001 and the third node M3 are electrically connected to each other. At this point, the first start pulse SSP1 is not supplied to the first input terminal 1001. Accordingly, the first input terminal 1001 is set to a high voltage. Therefore, when the first transistor M1 is turned-on, a high voltage is supplied to the third node N3 and the second node N2. Accordingly, the sixth transistor M6 and the seventh transistor M7 are turned-off.

When the eighth transistor M8 is turned-on, the second power VSS is supplied to the first node N1. Accordingly, the fourth transistor M4 and the fifth transistor M5 are turned-on. When the fifth transistor M5 is turned-on, the voltage of the first power VDD is supplied to the output terminal 1004. Then, the fourth transistor M4 and the fifth transistor M5 maintain the turned-on state in response to the voltage charged in the second capacitor C2. Accordingly, the output terminal 1004 is supplied with the voltage of the first power VDD with stability.

When the second clock signal CLK2 is received, the third transistor M3 is turned-on. At this point, since the fourth transistor M4 is set to a turned-on state, the voltage of the first power VDD is supplied to the third node N3 and the second node N2. The sixth transistor M6 and the seventh transistor M7 maintain the turned-off state with stability.

The second scan stage SST2 receives the output signal (that is, a scan signal) of the first scan stage SST1 synchronized with the second clock signal CLK2. The second scan stage SST2 outputs a scan signal to the second first scan line S12 synchronized with the first clock signal CLK1. The scan stages SST outputs the scan signal to the scan lines sequentially by repeating the aforementioned process.

In the present embodiment, the first transistor M1 may limit the minimum width of the voltage of the third node N3 regardless of the second node N2. Accordingly, it is possible to secure reliability of manufacturing costs and operation.

For example, when the scan signal is supplied to the output terminal 1004, the voltage of the second node N2 drops to approximately the voltage of VSS−(VDD−VSS). When, for example, the first power VDD is 7V and the second power VSS is −8V, the voltage of the second node N2 drops to approximately −20V, even when the threshold voltage of the transistors are taken into consideration.

If the first transistor M1 is deleted, Vds of the second transistor M2 and Vgs of the seventh transistor M7 are set to approximately −27V. Therefore, the second transistor M2 and the seventh transistor M7 must be made of highly pressure-resistant components. Furthermore, if a high voltage is applied to the second transistor M2 and the seventh transistor M7, a large amount of power is consumed and reliability of operation deteriorates. However, if the first transistor M1 is added between the third node N3 and the second node N2 as in the present embodiment, the voltage of the third node N3 is maintained at approximately the voltage of the second power VSS. Accordingly, Vds of the second transistor M2 and Vgs of the seventh transistor M7 are set to approximately −14V.

Figure 8:
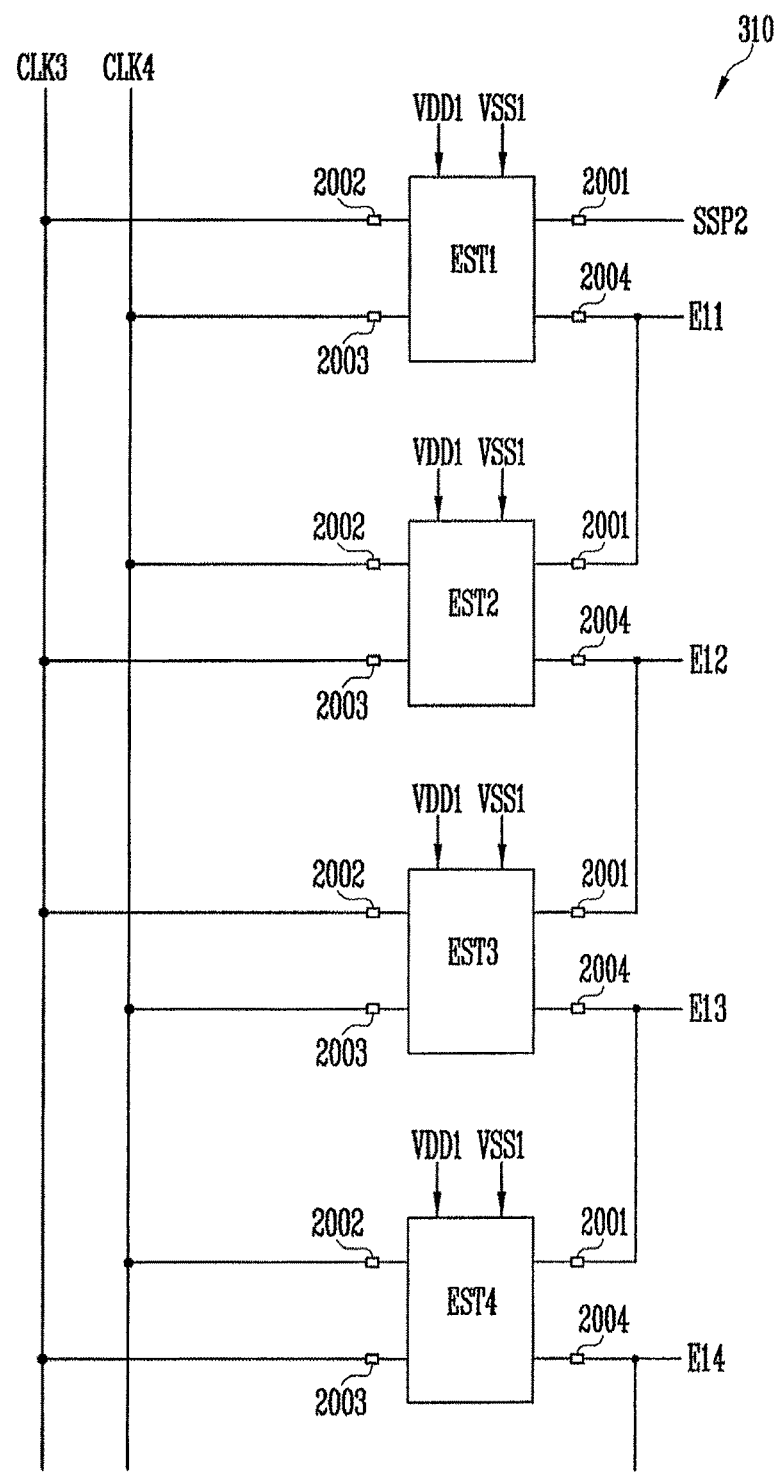
FIG. 8 illustrates an embodiment of a light emission driver.

FIG. 8 illustrates an embodiment of the light emission driver 310 which includes a plurality of light emission stages EST1 to EST4. Each of the light emission stages EST1 to EST4 is connected to one of the first light emission control lines E11 to E14 and is operated in response to the clock signal CLK3 and CLK4. These light emission stages EST1 to EST4 may have the same circuit configuration. Although four light emission stages are illustrated, the light emission driver 310 may have a different number of stages in another embodiment.

Each of the light emission stages EST1 to EST4 includes a first input terminal 2001 to a third input terminal 2003, and an output terminal 2004. The first input terminal 2001 receives an output signal (that is, light emission control signal) of a previous light emission stage or a second start pulse SSP2. For example, the first input terminal 2001 of the first light emission stage EST1 receives the second start pulse SSP2 and remaining ones of the light emission stages EST2 to EST4 are supplied with the output signal of the previous stage.

The second input terminal 2002 of a $j^{th}$ light emission stage ESTj receives the third clock signal CLK3. The third input terminal 2003 of the $j^{th}$ light emission stage ESTj receives the fourth clock signal CLK4. The second input terminal 2002 of a $j+1^{th}$ light emission stage ESTj+1 receives the fourth clock signal CLK4. The third input terminal 2003 of the $j+1^{th}$ light emission stage ESTj+1 receives the third clock signal CLK3. The third clock signal CLK3 and the fourth clock signal CLK4 may have a same cycle, but their phases do not overlap. For example, each of the clock signals CLK3 and CLK4 may have a cycle of 2H and may be supplied in different horizontal periods.

Each of the light emission stages EST1 to EST4 receives the voltage of a third power source VDD1 and the voltage of a fourth power VSS1. The third power source voltage VDD1 may be a gate off voltage. The fourth power source voltage VSS1 may be a gate on voltage. The third power source voltage VDD1 may be the same as the first power source voltage VDD. The fourth power source voltage VSS1 may be the same as the second power source voltage VSS.

Figure 9:
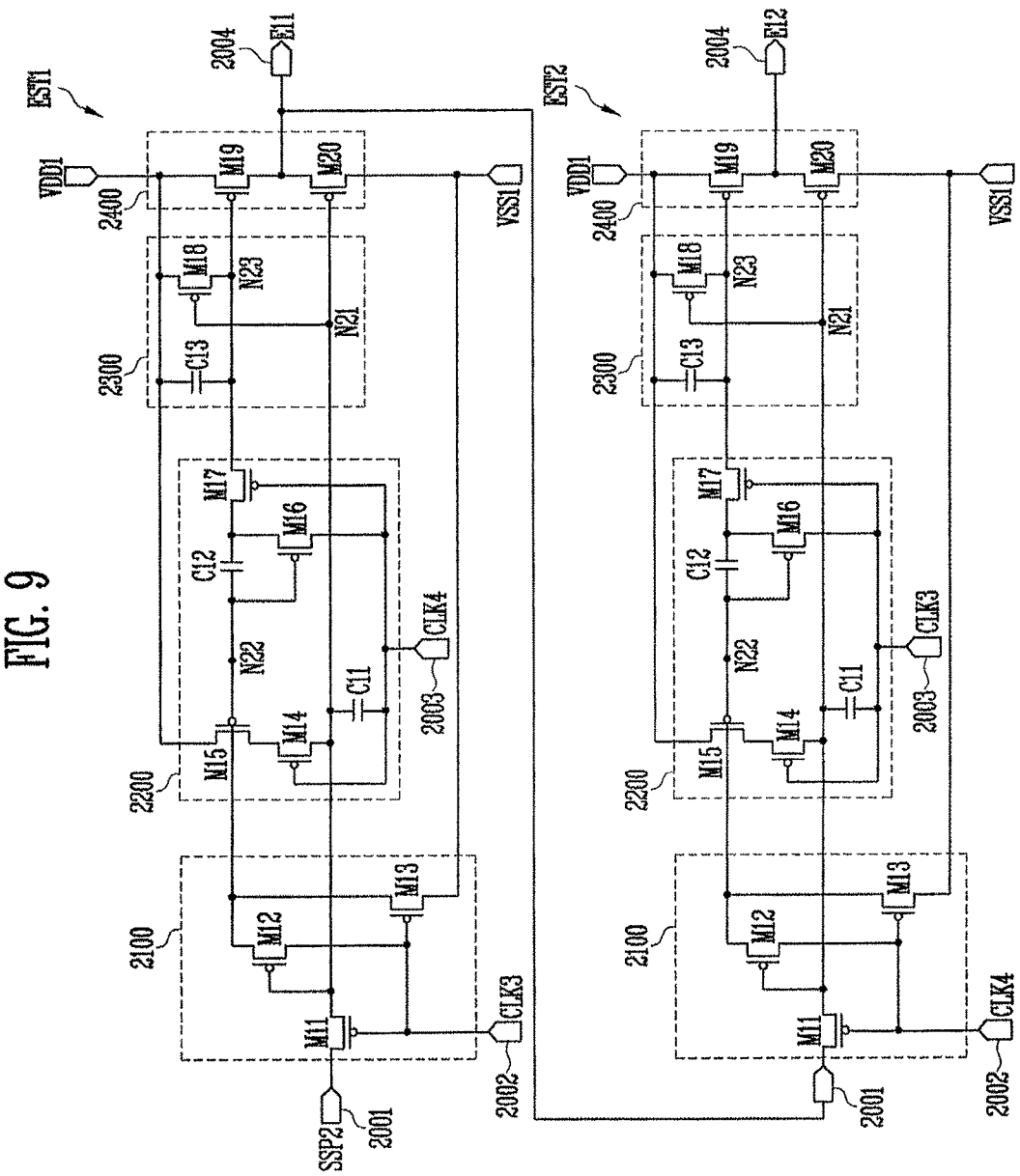
FIG. 9 illustrates an embodiment of a light emission stage.

FIG. 9 illustrates an embodiment of a light emission stage, which, for example, may be representative of the light emission stages EST1 to EST4 in FIG. 8. For illustrative purposes only, the first light emission stage EST1 and the second light emission stage ETS2 are illustrated.

Referring to FIG. 9, the first light emission stage EST1 includes a first signal processor 2100, a second signal processor 2200, a third signal processor 2300, and an output circuit 2400 (or buffer). The first signal processor 2100 controls a voltage of a twenty-second node N22 and a voltage of a twenty-first node N21 in response to signals received by the first input terminal 2001 and the second input terminal 2002. The first signal processor 2100 includes an eleventh transistor M11 to a thirteenth transistor M13.

The eleventh transistor M11 is between the first input terminal 2001 and the twenty-first node N21. The eleventh transistor M11 has a gate electrode connected to the second input terminal 2002. The eleventh transistor M11 is turned-on when the third clock signal CLK3 is supplied to the second input terminal 2002.

The twelfth transistor M12 is between the second input terminal 2002 and the twenty-second node N22. The twelfth transistor M12 has a gate electrode connected to the twenty-first node N21. The twelfth transistor M12 is turned-on or turned-off in response to the voltage of the twenty-first node N21.

The thirteenth transistor M13 is between the fourth power source VSS1 and the twenty-second node N22. The thirteenth transistor M13 has a gate electrode connected to the second input terminal 2002. The thirteenth transistor M13 is turned-on when the third clock signal CLK3 is supplied to the second input terminal 2002.

The second signal processor 2200 controls a voltage of the twenty-first node N21 and the twenty-third node N23 in response to the signals received by the third input terminal 2003 and the voltage of the twenty-second node N22. The second signal processor 2200 includes a fourteenth transistor M14 to a seventeenth transistor M17, an eleventh transistor C11, and a twelfth transistor C12.

The fourteenth transistor M14 is between the fifteenth transistor M15 and the twenty-first node N21. The fourteenth transistor M14 includes a gate electrode connected to the third input terminal 2003. The fourteenth transistor M14 is turned-on when the fourth clock signal CLK4 is supplied to the third input terminal 2003.

The fifteenth transistor M15 is between the third power source VDD1 and the fourteenth transistor M14. The fifteenth transistor M15 has a gate electrode connected to the twenty-second node N22. The fifteenth transistor M15 is turned-on or turned-off in response to the voltage of the twenty-second node N22.

The sixteenth transistor M16 is between the first electrode of the seventeenth transistor M17 and the third input terminal 2003. The sixteenth transistor M16 has a gate electrode connected to the twenty-second node N22. The sixteenth transistor M16 is turned-on or turned-off in response to the voltage of the twenty-second node N22.

The seventeenth transistor M17 is between the first electrode of the sixteenth transistor M16 and the twenty-third node N23. The seventeenth transistor M17 has a gate electrode connected to the third input terminal 2003. The seventeenth transistor M17 is turned-on or turned-off when the fourth clock signal CLK4 is supplied to the third input terminal 2003.

The eleventh capacitor C11 is connected between the twenty-first node N21 and the third input terminal 2003.

The twelfth capacitor C12 is connected between the twenty-second node N22 and the first electrode of the seventeenth transistor M17.

The third signal processor 2300 controls the voltage of the twenty-third node N23 in response to the voltage of the twenty-first node N21. The third signal processor 2003 includes the eighteenth transistor M18 and the thirteenth capacitor C13.

The eighteenth transistor M18 is between the third power source VDD1 and the twenty-third node N23. The eighteenth transistor M18 has a gate electrode connected to the twenty-first node N21. The eighteenth transistor M18 is turned-on or turned-off in response to the voltage of the twenty-first node N21.

The thirteenth capacitor C13 is between the third power source VDD1 and the twenty-third node N23.

The output circuit 2400 controls the voltage supplied to the output terminal 2004 based on the voltage of the twenty-first node N21 and the twenty-third node N23. The output circuit 2400 includes a nineteenth transistor M19 and a twentieth transistor M20.

The nineteenth transistor M19 is between the third power VDD1 and the output terminal 2004. The nineteenth transistor M19 has a gate electrode connected to the twenty-third node N23. The nineteenth transistor M19 is turned-on or turned-off in response to the voltage of the twenty-third node N23.

The twentieth transistor M20 is between the output terminal 2004 and the fourth power VSS1. The twentieth transistor M20 has a gate electrode connected to the twenty-first node N21. The twentieth transistor M20 is turned-on or turned-off in response to the voltage of the twenty-first node N21. The output circuit 2400 operates as a buffer. In another embodiment, the nineteenth transistor M19 and/or the twentieth transistor M20 may be replacement by circuits that include a plurality of transistors connected in parallel.

Figure 10:
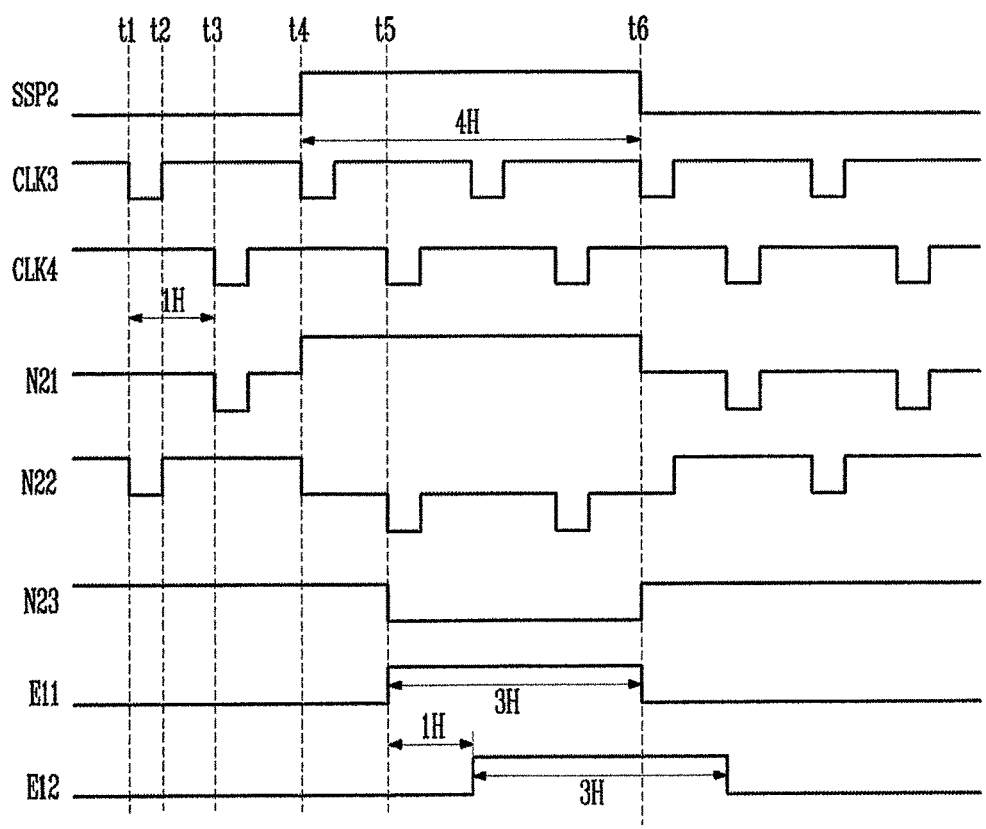
FIG. 10 illustrates an embodiment of a method for driving a light emission stage.

FIG. 10 illustrates an embodiment of a method for driving the light emission stage in FIG. 9. For illustrative purposes only, the method is described as being applied to the first light emission stage EST1.

Referring to FIG. 10, the third clock signal CLK3 and the fourth clock signal CLK4 have a cycle of two horizontal period 2H. The third clock signal CLK3 and the fourth clock signal CLK4 are supplied in different horizontal periods. For example, the fourth clock signal CLK4 is set as a signal shifted by as much as a half cycle (that is, one horizontal period 1H) from the third clock signal CLK3.

When the second start pulse SSP2 is received, the first input terminal 2001 may be set to a voltage of the third power source VDD1. When the second start pulse SSP2 is not received, the first input terminal 2001 may be set to a voltage of the fourth power source VSS1. When a clock signal CLK is received by the second input terminal 2002 and the third input terminal 2003, the second input terminal 2002 and the third input terminal 2003 may be set to a voltage of the fourth power source VSS1. When the clock signal CLK is not received by the second input terminal 2002 and the third input terminal 2003, the second input terminal 2002 and the third input terminal 2003 may be set to a voltage of the third power source VDD1.

The second start pulse SSP2 received by the second input terminal 2002 may be synchronized with the clock signal is received by the second input terminal 2002, e.g., the third clock signal CLK3. The second start pulse SSP2 may have a greater width than the third clock signal CLK3. For example, the second start pulse SSP2 may be supplied for four horizontal periods 4H.

More specifically, in operation, at a first time t1, the third clock signal CLK3 is received by the second input terminal 2002. When the third clock signal CLK3 is received by the second input terminal 2002, the eleventh transistor M11 and the thirteenth transistor M13 are turned-on.

When the eleventh transistor M11 is turned-on, the first input terminal 2001 is electrically connected to the twenty-first node N21. At this point, since the second start pulse SSP2 is not received by the first input terminal 2001, a low voltage is supplied to the twenty-first node N21.

When the low voltage is supplied to the twenty-first node N21, the twelfth transistor M12, the eighteenth transistor M18, and the twentieth transistor M20 are turned-on.

When the eighteenth transistor M18 is turned-on, the third power source voltage VDD1 is supplied to the twenty-third node N23. Accordingly, the nineteenth transistor M19 is turned-off. At this point, the thirteenth capacitor C13 charges a voltage corresponding to the third power source voltage VDD1. Accordingly, even after the first time t1, the nineteenth transistor M19 maintains the turned-off state with stability.

When the twentieth transistor M20 is turned-on, a voltage of the fourth power source VSS1 is supplied to the output terminal 2004. Therefore, at the first time t1, a light emission control signal is not supplied to the first light emission control line E11.

When the twelfth transistor M12 is turned-on, the third clock signal CLK3 is supplied to the twenty-second node N22. When the thirteenth transistor M13 is turned-on, a voltage of the fourth power source VSS1 is supplied to the twenty-second node N22. In this case, the third clock signal CLK3 is set to the voltage of the fourth power source VSS1. Accordingly, the twenty-second node N22 is set to the voltage of the fourth power source VSS1 with stability. When the voltage of the twenty-second node N22 is set to the fourth power source VSS1, the seventeenth transistor M17 is set to a turned-off state. Therefore, the voltage of the twenty-third node N23 is maintained at the voltage of the third power source VDD1 regardless of the voltage of the twenty-second node N22.

At a second time t2, supply of the third clock signal CLK3 to the second input terminal 2002 is stopped. When the supply of the third clock signal CLK3 is stopped, the eleventh transistor M11 and the thirteenth transistor M13 are turned-off. At this point, the voltage of the twenty-first node N21 is maintained at a low voltage by the eleventh capacitor C11. Accordingly, the twelfth transistor M12, the eighteenth transistor M18, and the twentieth transistor M20 maintain their turned-on state.

When the twelfth transistor M12 is turned-on, the second input terminal 2002 and the twenty-second node N22 are electrically connected to each other. At this point, the twenty-second node N22 is set to a high voltage.

When the eighteenth transistor M18 is turned-on, a voltage of the third power source VDD1 is supplied to the twenty-third node N23. Accordingly, the nineteenth transistor M19 maintains the turned-off state.

When the twentieth transistor M20 is turned-on, a voltage of the fourth power source VSS1 is supplied to the output terminal 2004.

At a third time t3, the fourth clock signal CLK4 is received by the third input terminal 2003. When the fourth clock signal CLK4 is received by the third input terminal 2003, the fourteenth transistor M14 and the seventeenth transistor M17 are turned-on.

When the seventeenth transistor M17 is turned-on, the twelfth capacitor C12 and the twenty-third node N23 are electrically connected to each other. At this point, the twenty-third node N23 maintains the voltage of the third power source VDD1. Furthermore, as the fourteenth transistor M14 is turned-on, the fifteenth transistor M15 is set to a turned-off state. Thus, even if the fourteenth transistor M14 is turned-on, the voltage of the twenty-first node N21 does not change.

When the fourth clock signal CLK4 is received by the third input terminal 2003, the twenty-first node N21 drops to a voltage lower than the fourth power source voltage VSS1 due to coupling of the eleventh capacitor C11. When a voltage of the twenty-first node N21 drops to a voltage lower than the fourth power source voltage VSS1, the operational characteristics of the eighteenth transistor M18 and the twentieth transistor M20 improve, e.g., the lower the level of the voltage a PMOS transistor is applied with better the operational characteristics.

At a fourth time t4, the second start pulse SSP2 is received by the first input terminal 2001. The third clock signal CLK3 is received by the second input terminal 2002. When the third clock signal CLK3 is received by the second input terminal 2002, the eleventh transistor M11 and the thirteenth transistor M13 are turned-on. When the eleventh transistor M11 is turned-on, the first input terminal 2001 is electrically connected to the twenty-first node N21. At this point, since the second start pulse SSP2 is received by the first input terminal 2001, a high voltage is supplied to the twenty-first node N21. When the high voltage is supplied to the twenty-first node N21, the twelfth transistor M12, the eighteenth transistor M18, and the twentieth transistor M20 are turned-off.

When the thirteenth transistor M13 is turned-on, a voltage of the fourth power source VSS1 is supplied to the twenty-second node N22. At this point, since the fourteenth transistor M14 is set to a turned-off state, the twenty-first node N21 maintains the high voltage. Furthermore, since the seventeenth transistor M17 is set to a turned-off state, the voltage of the twenty-third node N23 is maintained at a high voltage by the thirteenth transistor C13. Therefore, the nineteenth transistor M19 maintains the turned-off state.

At a fifth time t5, the fourth clock signal CLK4 is received by the third input terminal 2003. When the fourth clock signal CLK4 is received by the third input terminal 2003, the fourteenth transistor M14 and the seventeenth transistor M17 are turned-on. Since the twenty-second node N22 is set to a voltage of the fourth power source VSS1, the fifteenth transistor M15 and the sixteenth transistor M16 are turned-on.

When the sixteenth transistor M16 and the seventeenth transistor M17 are turned-on, the fourth clock signal CLK4 is supplied to the twenty-third node N23. When the fourth clock signal CLK4 is supplied to the twenty-third node N23, the nineteenth transistor M19 is turned-on. When the nineteenth transistor M19 is turned-on, a voltage of the third power source VDD1 is supplied to the output terminal 2004. The voltage of the third power source VDD1 supplied to the output terminal 2004 is a light emission control signal to be supplied to the first light emission control line E11.

When the voltage of the fourth clock signal CLK4 is supplied to the twenty-third node N23, the voltage of the twenty-second node N22 drops to a voltage lower than the fourth power VSS1 due to coupling of the twelfth capacitor C12. Accordingly, the operational characteristics of the transistors connected to the twenty-second node N22 may improve.

When the fourteenth transistor M14 and the fifteenth transistor M15 are turned-on, the voltage of the third power source VDD1 is supplied to the twenty-first node N21. As the voltage of the third power source VDD1 is supplied to the twenty-first node N21, the twentieth transistor M20 maintains the turned-off state. Therefore, the voltage of the third power source VDD1 may be supplied to the first light emission control line E11 with stability.

At a sixth time t6, the third clock signal CLK3 is received by the second input terminal 2002. When the third clock signal CLK3 is received by the second input terminal 2002, the eleventh transistor M11 and thirteenth transistor M13 are turned-on.

When the eleventh transistor M11 is turned-on, the twenty-first node N21 is electrically connected to the first input terminal 2001. Accordingly, the twenty-first node N21 is set to a low voltage. When the twenty-first node N21 is set to a low voltage, the eighteenth transistor M18 and the twentieth transistor M20 are turned-on.

When the eighteenth transistor M18 is turned-on, the voltage of the third power source VDD1 is supplied to the twenty-third node N23. Accordingly, the nineteenth transistor M19 is turned-off. When the twentieth transistor M20 is turned-on, the voltage of the fourth power source VSS1 is supplied to the output terminal 2004. The voltage of the fourth power source VSS1 supplied to the output terminal 2004 is supplied to the first light emission control line E11. Accordingly, the supply of the light emission control line is stopped.

The light emission stages EST output a light emission control signal to the light emission control lines sequentially as the aforementioned process is repeated. Even through the transistors are illustrated as PMOS transistors, the transistors may be NMOS transistors in other embodiments.

Figure 11:
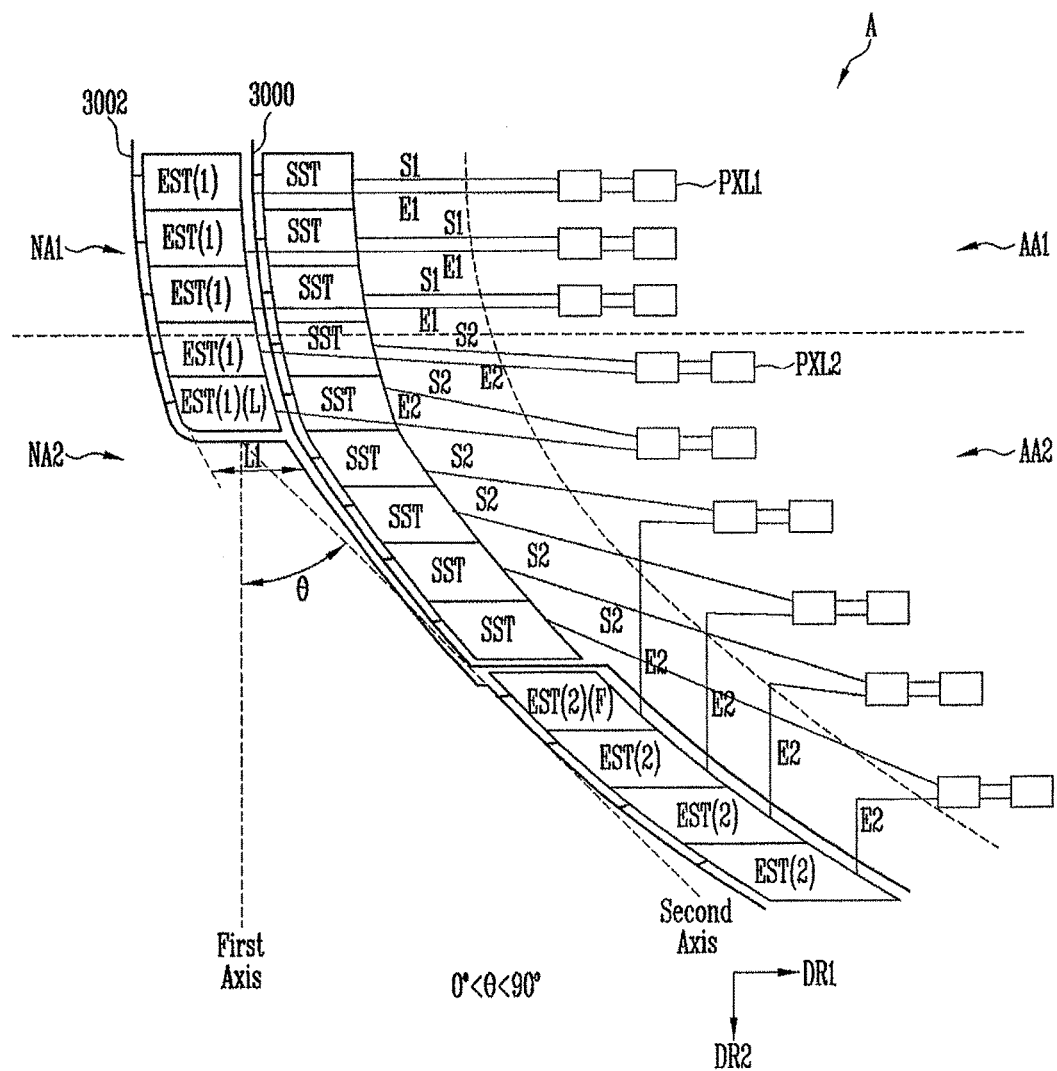
FIG. 11 illustrates an enlarged view of area in FIG. 2A.

FIG. 11 illustrates a first embodiment of area A of the display device in FIG. 2A. Area A includes a portion of a bottom end of the first pixel area AA1 and a corner portion of the second pixel area AA2 configured in a curved line (or diagonal line) form.

Referring to FIG. 11, the first pixels PXL1 in the first pixel area AA1 are disposed so that a plurality of the first pixels PXL1 are on every horizontal line in a first direction DR1 and second direction DR2. The first pixel area AA1 may be, for example, rectangular. Therefore, the same number of first pixels PXL1 may be on each horizontal line. The first pixel area AA1 may have a different shape and/or may have a different number of the first pixels PXL1 on each horizontal line in another embodiment.

In the second pixel area AA2, at least one horizontal line may have a different number of second pixels PXL2. For example, a corner portion having a curved line form (or diagonal line form) is in the second pixel area AA2. A first number of second pixels are on a first horizontal line near the first pixel area AA1. A second number of second pixels PXL2 may be on a second horizontal line at a bottom end of the second pixel area AA2. The second number may be less than the first number.

More specifically, based on the location of an outermost pixel in the first pixel area AA1, as the horizontal line in the second pixel area AA2 proceeds in the second direction DR2 the horizontal line may become more and more distanced from the outermost pixel. Accordingly, the number of second pixels PXL2 on the horizontal line may gradually decrease. When the number of second pixels PXL2 on at least one horizontal line gradually decreases, the corner portion of the second pixel area AA2 may have a curved line form or diagonal line form.

FIG. 11 illustrates that the second pixels PXL2 have six horizontal lines. The number of second pixels PXL2 in the second pixel area AA2 per horizontal line and/or the number of horizontal lines in the second pixel area AA2 may be different in another embodiment. Furthermore, FIG. 11 illustrates only the left side of the pixel areas AA1 and AA2 for convenience sake. But, there may be a right area of the pixel areas AA1 and AA2, such that the left side and the right side are symmetrical to each other.

Referring to FIG. 11, stages of different drivers (e.g., scan and light emission control drivers) are arranged in a direction of a second axis which is different from a first axis along which other stages are arranged. An angle between the first axis and the second axis is an acute angle greater than 0°. These features are discussed in greater detail below.

The scan stages SST and the light emission stages EST1 and EST2 are provided in the first neighboring area NA1 and in the second neighboring area NA2. The scan stages SST of the scan driver 210 may be arranged in a certain curved line form (diagonal line form) depending on the form of the first pixel area AA1 and the second pixel area AA2. These scan stages SST may sequentially supply a scan signal to the first scan lines S1 and the second scan lines S2.

The light emission stages EST1 and EST2 in the light emission driver 310 are arranged in accordance with the form of the first pixel area AA1 and the second pixel area AA2. The first light emission stages EST1 and the second light emission stages EST2 may be differentiated depending on the light emission control lines E1 and E2 to which they are connected.

The first light emission stages EST1 are arranged, side-by-side, in at least one side of the scan stages SST and may supply a light emission control signal to the first light emission control lines E1 in the first pixel area AA1 and to one or more of the second light emission control lines E2 in the second pixel area AA2. For example, the first light emission stages EST1 may sequentially supply the light emission control signal to the first light emission control lines E1 and to the second light emission control lines E2 to which they are connected.

The second light emission stages EST2 are spaced from the first light emission stages EST1. For example, the second light emission stages EST2 may be at a lower side of the scan stages SST.

These second light emission stages EST2 are in the second neighboring area NA2 and supply the light emission control signal to the rest of the second light emission control lines E2 that are not connected to the first light emission stages EST1. For example, the second light emission stages EST2 may sequentially supply the light emission control signal to the rest of the second light emission control lines E2. In this case, a first second light emission stage EST(2)(F) operates in response to a light emission control signal from a last first light emission stage EST(1)(L). Thus, the light emission control signal from the last first light emission stage EST(1)(L) is used as the start pulse in the first second light emission stage EST(2)(F).

When the second light emission stages EST2 are spaced from the first light emission stages EST1 and are at a lower side of the scan stages SST, the dead (or unused) space of the second neighboring area NA2 may be reduced or minimized. For example, when the second light emission stages EST2 are adjacent to the first light emission stages EST1 (e.g., when the second light emission stages EST2 are at a lower side of the first light emission stages EST1), the surface area of the second neighboring area NA2 must be increased by as much as a first length L1.

When the second light emission stages EST2 are spaced from the first light emission stages EST1 (e.g., when the second light emission stages EST2 are at a lower side of the scan stages SST), the surface area of the second neighboring area NA2 is decreased by as much as the first length L1, thereby reducing or minimizing dead space.

The scan stages SST are connected to first signal wires 3000, which supply the aforementioned first clock signal CLK1, the second clock signal CLK2, the first power source voltage VDD, and the second power source voltage VSS to the scan stages SST1. The first signal wires 3000 are provided at one side of the scan stages SST.

The first light emission stages EST1 and the second light emission stages EST2 are connected to second signal wires 3002. The second signal wires 3002 supply the aforementioned third clock signal CLK3, the fourth clock signal CLK4, the third power VDD1, and the fourth power VSS1 to the light emission stages EST1 and EST2. The second signal wires 3002 are at one side of the light emission stages EST1 and EST2. The first signal wires 3000 may extend up to another side of the second light emission stages EST2.

At least one of the rest of the second light emission control lines E2 connected to the second light emission stages EST2 may cross at least one of the second scan lines S2 when connected to the second pixels PXL2. In this case, since the second light emission control lines E2 connected to the second light emission stages EST2 are made of a different metal from the second light emission control line E2 and the second scan lines S2, they may operate with stability without being electrically connected.

For example, in order to reduce or minimize resistance, the power line ELVDD and/or ELVSS are made using a first metal that is one of the metals forming the pixels PXL and a second metal to be disposed on a different layer from the first metal. In this case, even if the second light emission control line E2 is made of the second metal and it crosses the second scan line S2 formed simultaneously with the pixels PXL, the second light emission control line E2 and the second scan line S2 are not electrically connected to each other.

Figure 12:
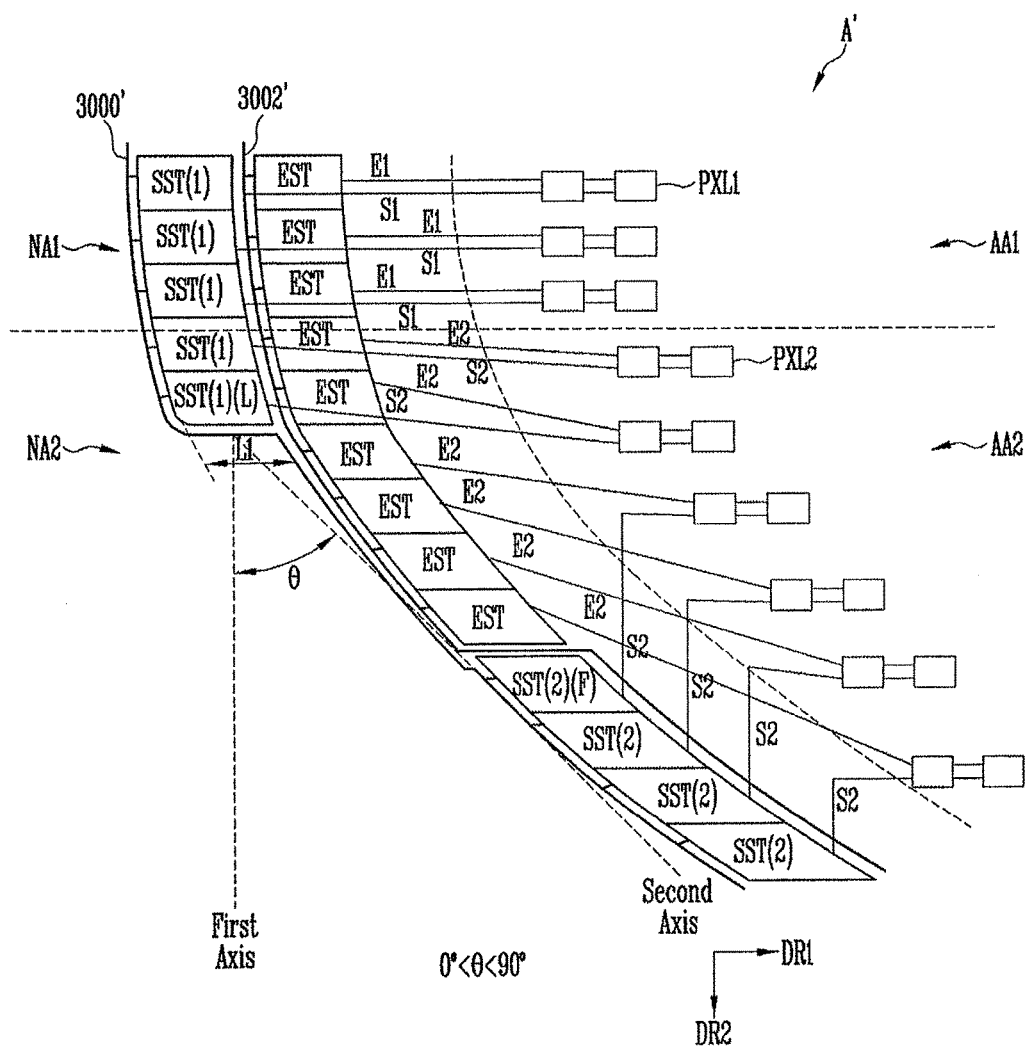
FIG. 12 illustrates an enlarged view of area A in FIG. 2B.

FIG. 12 illustrates a second embodiment of area A' of the display device in FIG. 2B. In FIG. 12, the scan driver 210 is on an exterior side of the substrate and the light emission driver 310 is on an interior side of the substrate.

Referring to FIG. 12, stages of different drivers (e.g., scan and light emission control drivers) are arranged in a direction of a second axis which is different from a first axis along which other stages are arranged. An angle between the first axis and the second axis is an acute angle greater than 0°. These features are discussed in greater detail below.

As illustrated in FIG. 12, the first scan stages SST1, the second scan stages SST2, and the light emission stages EST are in the first neighboring area NA1 and in the second neighboring area NA2. The light emission stages EST in the light emission driver 310 are arranged in accordance with the form of the first pixel area AA1 and the second pixel area AA2. These light emission stages EST sequentially supply a light emission control signal to the first light emission control lines E1 and the second light emission control lines E2.

The scan stages SST1 and SST2 in the scan driver 210 are arranged in accordance with the form of the first pixel area AA1 and the second pixel area AA2. Theses scan stages SST1 and SST2 include the first scan stages SST1 and the second stages SST2. The first scan stages SST1 are arranged, side-by-side, along at least one side of the light emission stages EST and supply a scan signal to the first scan lines S1 in the first pixel area AA1 and to at least one of the second scan lines S2 in the second pixel area. For example, the first scan stages SST1 may sequentially supply a scan signal to the first scan signals S1 and to the second scan signals S2 to which they are connected.

The second scan stages SST2 are spaced from the first scan stages SST1. For example, the second scan stages SST2 may be at a lower side of the light emission stages EST. These second scan stages SST2 are in the second pixel area AA2 and supply a scan signal to the rest of the second scan lines S2 not connected to the first scan stages SST1.

For example, the second stages SST2 may sequentially supply the scan signal to the rest of the second scan lines S2. The first second scan stage SST(2)(F) operates in response to the scan signal from the last first scan stage SST(1)(L). The scan signal from the last first scan stage SST(1)(L) is used as a start pulse in the first second scan stage SST(2)(F).

When the second scan stages SST2 are spaced from the first scan stages SST1 and at a lower side of the light emission stages EST as previously mentioned, dead (or unused) space of the second neighboring area NA may be reduced or minimized.

Specifically, when the second scan stages SST2 are adjacent to the first scan stages SST1 (e.g., when the second stages SST2 are at a lower side of the first scan stages SST1), the surface area of the second neighboring area NA2 must be increased, for example, by as much as the first length L1.

However, when the second scan stages SST2 are spaced from the first scan stages SST1 in accordance with one or more of the embodiments disclosed herein (e.g., where the second scan stages SST2 are at a lower side of the light emission stages EST), the surface area of the second neighboring area NA2 is reduced, for example, by as much as the first length L1, thereby reducing or minimizing the dead space.

The light emission stages EST are connected to second signal wires 3002', which carry the aforementioned third clock signal CLK3, the fourth clock signal CLK4, the third power VDD1, and the fourth power source voltage VSS1. The second signal wires 3002' are at one side of the light emission stages EST. Furthermore, the second signal wires 3002' may be arranged to extend up to the other side of the second light emission stages SST2.

The scan stages SST1 and SST2 are connected to the first signal wires 3000', which carry a first clock signal CLK1, the second clock signal CLK2, the first power VDD, and the second power VSS. These first signal wires 3000' are at one side of the scan stages SST1 and SST2.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A display device, comprising:
    first pixels in a first pixel area, the first pixels electrically connected to first signal lines, second signal lines, and data lines;
    second pixels in a second pixel area having a shape different from the first pixel area, the second pixels electrically connected to third signal lines, fourth signal lines, and the data lines;
    first driver stages to supply a first signal to the first and third signal lines;
    second driver stages to supply a second signal to the second signal lines and at least one of the fourth signal lines; and
    third driver stages to supply the second signal to the fourth signal lines other than the at least one fourth signal line connected to the second driver stages, wherein
    the second driver stages are spaced from the third driver stages such that the first driver stages are between the second driver stages and the first pixels in a first direction, and at least one of the third driver stages is adjacent to at least one of the first driver stages in a second direction crossing the first direction.

2. The display device as claimed in claim 1, wherein:
    the first and third signal lines are scan lines, and
    the first signal is a scan signal.

3. The display device as claimed in claim 2, wherein:
    the second and fourth signal lines are light emission control lines, and
    the second signal is a light emission control signal.

4. The display device as claimed in claim 1, wherein:
    the first and third signal lines are light emission control lines, and
    the first signal is a light emission control signal.

5. The display device as claimed in claim 4, wherein:
    the second and fourth signal lines are scan lines, and
    the second signal is a scan signal.

6. The display device as claimed in claim 1, wherein:
    the second pixel area is adjacent to the first pixel area.

7. The display device as claimed in claim 1, wherein the first pixel area has a greater surface area than the second pixel area.

8. The display device as claimed in claim 1, wherein a same number of first pixels are arranged on each horizontal line in the first pixel area.

9. The display device as claimed in claim 1, wherein:
    a first number of second pixels are on a first horizontal line at an upper side of the second pixel area, and
    a second number of second pixels are on a second horizontal line at a lower side of the second pixel area, wherein the second number is different from the first number.

10. The display device as claimed in claim 9, wherein a greater number of second pixels are on the first horizontal line than on the second horizontal line.

11. The display device as claimed in claim 9, wherein an upper side of the second pixel area is adjacent to the first pixel area.

12. The display device as claimed in claim 1, wherein the second driver stages are adjacent to one side of some of the first driver stages in the first direction.

13. The display device as claimed in claim 1, wherein the at least one of the third driver stages is adjacent to a lower side of the at least one of the first driver stages in the second direction.

14. The display device as claimed in claim 1, further comprising:
    first signal wires at one side of the first driver stages,
    wherein the first signal wires are to supply power and driving signals to the first driver stages.

15. The display device as claimed in claim 1, further comprising:
    second signal wires at one side of the second driver stages and the third driver stages,
    wherein the second signal wires are to supply power and driving signals to the second driver stages and to the third driver stages.

16. A display device, comprising:
    first driver stages to supply a first signal to first signal lines in a first pixel area and in a second pixel area having a shape different from the first pixel area;
    second driver stages to supply a second signal to second signal lines in the first pixel area and to at least one third signal line in the second pixel area; and
    third driver stages to supply the second signal to third signal lines other than the at least one third signal line in the second pixel area, wherein a first one of the third driver stages is to operate based on the second signal from a last one of the second driver stages, wherein
    the second driver stages are spaced from the third driver stages such that the first driver stages are between the second driver stages and the first pixels in a first direction, and at least one of the third driver stages is adjacent to at least one of the first driver stages in a second direction crossing the first direction.

17. The display device as claimed in claim 16, wherein:
    the first signal lines are scan lines, and
    the first signal is a scan signal.

18. The display device as claimed in claim 17, wherein:
    the second and third signal lines are light emission control lines, and
    the second signal is a light emission control signal.

19. The display device as claimed in claim 16, wherein:
    the first signal lines are light emission control lines, and
    the first signal is a light emission control signal.

20. The display device as claimed in claim 19, wherein:
    the second and third signal lines are scan lines, and
    the second signal is a scan signal.

21. The display device as claimed in claim 16, wherein the first pixel area has a greater surface area than the second pixel area.

22. The display device as claimed in claim 16, wherein a same number of first pixels are on each horizontal line in the first pixel area.

23. The display device as claimed in claim 16, wherein:
    a first number of second pixels are on a first horizontal line at an upper side of the second pixel area, and
    a second number of second pixels are on a second horizontal line at a lower side of the second pixel area, wherein the second number is less than the first number.

24. The display device as claimed in claim 23, wherein an upper side of the second pixel area is adjacent to the first pixel area.

25. The display device as claimed in claim 16, wherein the second driver stages are at one side of some of the first driver stages.

26. The display device as claimed in claim 16, wherein the third stages are at a lower side of the first driver stages.

27. A display device, comprising:
    pixels including first pixels in a first pixel area and second pixels in a second pixel area having a shape different from the first pixel area;
    first driver stages to supply a first signal to the first and second pixels;

second driver stages to supply a second signal which is different from the first signal to the first pixels, and third driver stages to supply the second signal to the second pixels, wherein:

the first driver stages are between the second driver stages and the first pixels in a first direction, and at least one of the third driver stages is adjacent to at least one of the first driver stages in a second direction crossing the first direction.

28. The display device as claimed in claim 27, wherein the third driver stages are aligned along a first curve.

29. The display device as claimed in claim 28, wherein the second pixels are aligned along a second curve.

30. The display device as claimed in claim 29, wherein the first curve is equal to the second curve.

31. The display device as claimed in claim 28, wherein the second driver stages are arranged in a direction different from the first curve.

* * * * *